(12) United States Patent
Wu et al.

(10) Patent No.: US 11,980,036 B2
(45) Date of Patent: May 7, 2024

(54) SEMICONDUCTOR STRUCTURE HAVING MEMORY DEVICE AND METHOD OF FORMING THE SAME

(71) Applicant: Taiwan Semiconductor Manufacturing Company, Ltd., Hsin-Chu (TW)

(72) Inventors: Chao-I Wu, Zhubei (TW); Yu-Ming Lin, Hsinchu (TW); Han-Jong Chia, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/873,207

(22) Filed: Jul. 26, 2022

(65) Prior Publication Data
US 2022/0359548 A1  Nov. 10, 2022

Related U.S. Application Data

(62) Division of application No. 17/132,305, filed on Dec. 23, 2020, now Pat. No. 11,411,011.

(60) Provisional application No. 63/040,653, filed on Jun. 18, 2020.

(51) Int. Cl.
*H10B 53/00* (2023.01)
*G11C 5/06* (2006.01)
(Continued)

(52) U.S. Cl.
CPC .............. *H10B 53/00* (2023.02); *G11C 5/06* (2013.01); *G11C 11/221* (2013.01); *H10B 51/00* (2023.02)

(58) Field of Classification Search
CPC ........ H10B 53/00; H10B 51/00; H10B 51/30; H10B 51/40; H10B 53/20; H10B 53/30;
(Continued)

(56) References Cited

U.S. PATENT DOCUMENTS 8,309,999 B2  11/2012  Wang
9,064,599 B2  6/2015  Fujita
(Continued)

FOREIGN PATENT DOCUMENTS

| CN | 101038906 A | 9/2007 |
| JP | 4466853 A | 9/2006 |
| KR | 20020017749 A | 8/2000 |

OTHER PUBLICATIONS

Notice of Allowance dated Apr. 5, 2022 for U.S. Appl. No. 17/132,305.
(Continued)

*Primary Examiner* — Julia Slutsker
(74) *Attorney, Agent, or Firm* — Eschweiler & Potashnik, LLC

(57) ABSTRACT

A semiconductor structure includes a substrate, an interconnection structure disposed over the substrate and a first memory cell. The first memory cell is disposed over the substrate and embedded in dielectric layers of the interconnection structure. The first memory cell includes a first transistor and a first data storage structure. The first transistor is disposed on a first base dielectric layer and embedded in a first dielectric layer. The first data storage structure is embedded in a second dielectric layer and electrically connected to the first transistor. The first data storage structure includes a first electrode, a second electrode and a storage layer sandwiched between the first electrode and the second electrode.

20 Claims, 27 Drawing Sheets

(51) Int. Cl.
*G11C 11/22* (2006.01)
*H10B 51/00* (2023.01)

(58) Field of Classification Search
CPC ..... G11C 5/06; G11C 11/221; G11C 11/2259; H01L 29/78391; H01L 29/40111; H01L 28/55
See application file for complete search history.

(56) References Cited

U.S. PATENT DOCUMENTS

| | | |
|---|---|---|
| 2004/0191929 A1 | 9/2004 | Lee |
| 2006/0181918 A1 | 8/2006 | Shin et al. |
| 2008/0054328 A1* | 3/2008 | Wang .................... H10B 53/00 257/306 |
| 2011/0049592 A1 | 3/2011 | Yoon et al. |
| 2011/0143506 A1 | 6/2011 | Lee |
| 2012/0003808 A1 | 1/2012 | Lee |
| 2018/0226415 A1 | 8/2018 | Ando et al. |
| 2020/0373313 A1 | 11/2020 | Tsukamoto |
| 2022/0020757 A1* | 1/2022 | Kobayashi .......... G11C 11/2275 |

OTHER PUBLICATIONS

Francois et al. "Demonstration of BEOL-compatible ferroelectric Hf 0.5 Zr 0.5 O 2 scaled FeRAM co-integrated with 130nm CMOS for embedded NVM applications" 2019 IEEE International Electron Devices Meeting (IEDM), published Dec. 9, 2019.

* cited by examiner

SEMICONDUCTOR STRUCTURE HAVING MEMORY DEVICE AND METHOD OF FORMING THE SAME

REFERENCE TO RELATED APPLICATIONS

This Application is a Divisional of U.S. application Ser. No. 17/132,305, filed on Dec. 23, 2020, which claims the benefit of U.S. Provisional Application No. 63/040,653, filed on Jun. 18, 2020. The contents of the above-referenced Patent Applications are hereby incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
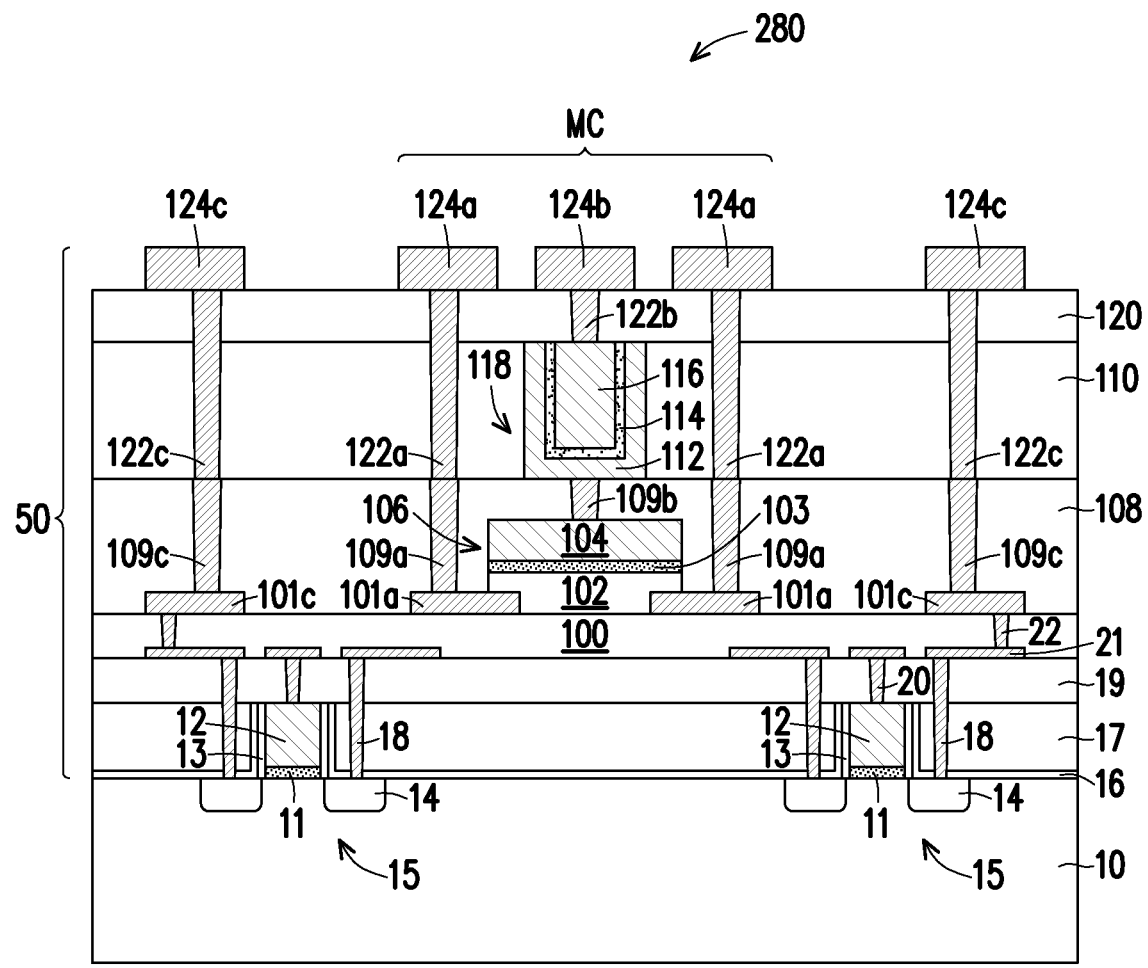
FIG. 1 is a cross-sectional view illustrating a semiconductor structure having a memory device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure may relate to (fin-type field-effect transistor) FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

FIG. 1 is a cross-sectional view illustrating a semiconductor structure according to some embodiments of the disclosure.

Referring to FIG. 1, in some embodiments, a semiconductor structure 500A includes a substrate 10, one or more transistor 15, an interconnection structure 50, and a memory device 280 embedded in the interconnection structure 50.

In some embodiments, the substrate 10 is a semiconductor substrate, such as a bulk semiconductor substrate, a semiconductor-on-insulator (SOI) substrate, or the like, which may be doped (e.g., with a p-type or an n-type dopant) or undoped. Other substrates, such as a multi-layered or gradient substrate may also be used. The substrate 10 may be a wafer, such as a silicon wafer. In some embodiments, the semiconductor material of the substrate 10 may include silicon; germanium; a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof.

Depending on the requirements of design, the substrate 10 may be a p-type substrate, an p-type substrate or a combination thereof and may have doped regions therein. The substrate 10 may be configured for an N-Metal Oxide Semiconductor (NMOS) device, a PMOS device, an N-type fin-type field effect transistor (FinFET) device, a P-type FinFET device, other kinds of devices (such as, multiple-gate transistors, gate-all-around transistors or nanowire transistors) or combinations thereof. In some embodiments, the semiconductor material of the substrate 10 for NMOS device or N-type FinFET device may include Si, SiP, SiC, SiPC, InP, GaAs, AlAs, InAs, InAlAs, InGaAs or combinations thereof. The semiconductor material of the substrate 10 for PMOS device or P-type FinFET device may include Si, SiGe, SiGeB, Ge, InSb, GaSb, InGaSb or combinations thereof.

In some embodiments, the substrate 10 includes one or more transistors 15 partially embedded therein. The transistors 15 are metal-oxide-semiconductor field-effect transistors (MOSFETs) and may be n-type MOSFET, p-type MOSFET or a combination thereof. In some embodiments, the transistors 15 may be or include planar MOSFET, FinFET, gate-all-around FET (GAA FET), or a combination thereof.

In some embodiments, the transistors 15 each include a gate dielectric layer 11, a gate electrode 12, spacers 13, and source/drain regions 14. The gate dielectric layer 11 is disposed on the substrate 10 and may include silicon oxide, silicon nitride, silicon oxynitride, a high-K dielectric material, or the like, or combinations thereof. The high-k dielectric material may have a dielectric constant such as greater than about 4, or greater than about 7 or 10. In some embodiments, the high-k dielectric material includes $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, combinations thereof, or other suitable material. In some embodiments, an interfacial layer (not shown) may be disposed between the gate dielectric layer 11 and the substrate 10. The interfacial layer may include an oxide such as a silicon oxide.

The gate electrode 12 is disposed on the gate dielectric layer 11 and separate from the substrate 10 by the gate dielectric layer 11. In some embodiments, the gate electrode 12 includes polysilicon and/or metallic materials. In some embodiments, the gate electrode layer 12 may include a work function metal layer and a metal layer on the work function metal layer. The work functional metal layer is configured to tune the work function of the transistor to achieve a desired threshold voltage Vt. The work function metal layer maybe an N-type work function metal layer or a P-type work function metal layer. In some embodiments, the P-type work function metal layer includes a metal with a sufficiently large effective work function and may include one or more of the following: TiN, WN, TaN, conductive metal oxide, and/or other suitable material, or combinations thereof. In alternative embodiments, the N-type work function metal layer includes a metal with sufficiently low effective work function and may include one or more of the following: tantalum (Ta), titanium aluminide (TiAl), titanium aluminum nitride (TiAlN), tantalum carbide (TaC), tantalum carbide nitride (TaCN), tantalum silicon nitride (TaSiN), titanium silicon nitride (TiSiN), other suitable metals, suitable conductive metal oxide, or combinations thereof. The metal layer may include copper, aluminum, tungsten, cobalt (Co), or any other suitable metallic material, or the like or combinations thereof.

The spacers 13 are disposed on the substrate 100 to cover sidewalls of the gate electrode 12 and sidewalls of the gate dielectric layer 11. The material of the spacers 13 may include silicon oxide, silicon nitride, silicon oxynitride, or combinations thereof.

The source/drain regions 14 are disposed in and/or on the substrate 10 and on sides of the gate stack including the gate electrode 12 and the gate dielectric layer 11. The source/drain regions 14 may be doped regions or epitaxial layers/regions configured for p-type MOSFET or n-type MOSFET, p-type FinFET, or n-type FinFET, respectively. The source/drain regions 14 may be disposed in a well region of the substrate, and the conductivity types of the source/drain regions 14 are opposite to the conductivity types of the corresponding well regions, respectively. In the embodiments in which the source/drain regions 14 are doped regions, the source/drain regions 14 may respectively include p-type dopants, such as boron, $BF_2^+$, or n-type dopants, such as phosphorus, arsenic.

In some embodiments, the source/drain regions 14 have silicide layers (not shown) formed thereon, respectively. The silicide layers include nickel silicide (NiSi), cobalt silicide (CoSi), titanium silicide (TiSi), tungsten silicide (WSi), molybdenum silicide (MoSi), platinum silicide (PtSi), palladium silicide (PdSi), CoSi, NiCoSi, NiPtSi, Ir, ParSi, ErSi, YbSi, PdSi, RhSi, or NbSi, or combinations thereof.

The interconnection structure 50 is disposed on the substrate 10 and the transistors 15. In some embodiments, the interconnection structure 50 includes a plurality of dielectric layers and a plurality of conductive features (or referred to as interconnect wirings) embedded in the dielectric layers. The conductive features are electrically connected to the transistors 15 to form a functional circuit. The plurality of dielectric layers may include one or more inter-layer dielectric layer (ILD) and one or more inter-metal dielectric layers (IMD). In some embodiments, the conductive features of the interconnection structure 50 may include a plurality of conductive contacts, conductive vias, and conductive lines. The conductive contacts are disposed in the ILDs to electrically connect to the transistors 15 and the conductive lines, while the conductive vias may be disposed in the IMDs to electrically connect to the conductive lines in different layers.

The materials of the dielectric layers may include silicon oxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the dielectric layer may include low-k dielectric material with a dielectric constant lower than 4, extreme low-k (ELK) dielectric material with a dielectric constant lower than 2.5. In some embodiments, the low-k material includes a polymer based material, such as benzocyclobutene (BCB), FLARE®, or SILK®; or a silicon dioxide based material, such as hydrogen silsesquioxane (HSQ) or SiOF. The materials of the conductive features may include barrier materials such as titanium, tantalum, titanium nitride, tantalum nitride, manganese nitride or combinations thereof; and conductive materials including metal or metal alloy, such as tungsten (W), copper (Cu), Ru, Ir, Ni, Os, Rh, Al, Mo, Co, alloys thereof, combinations thereof tungsten (W), copper (Cu), copper alloys, aluminum (Al), alloys thereof, or combinations thereof.

For example, the interconnection structure 50 may include dielectric layers 17, 19, 100, 108, 110, 120, conductive contacts 18, 20, conductive lines 21, 101c, 124c, and conductive vias 22, 109c, 122c embedded in the corresponding dielectric layers. It is noted that, the dielectric layer over the conductive lines 124c is not shown in FIG. 1 for the sake of brevity. The number of dielectric layers and conductive features shown in the figures are merely for illustration, and the disclosure is not limited thereto. In some alternative embodiments, more dielectric layers and conductive features are disposed over the dielectric layer 120 and the conductive lines 124c, and the interconnection structure 50 may include any suitable number of dielectric layers with conductive features embedded therein, depending on product design and requirement.

In some embodiments, the dielectric layer 17 and the dielectric layer 19 may also be referred to as ILDs. The dielectric layer 17 is disposed on the substrate 10 and laterally aside the gate structure (including the gate dielectric layer 11, the gate electrode 12 and the spacers 13) of the transistors 15. In some embodiments, an etching stop layer 16 is disposed between the dielectric layer 17 and the spacers 13 of the gate structure, and between the dielectric layer 17 and the substrate 10. The material of the etching stop layer 16 is different from the dielectric layer 17. For example, the etching stop layer 16 may include SiN, SiC, SiOC, SiON, SiCN, SiOCN, or the like, or combinations thereof. In some embodiments, the etching stop layer 16 may also be referred to as contact etching stop layer (CESL).

The dielectric layer 19 is disposed on the dielectric layer 17 and the gate structure of the transistors 15. In some embodiments, etching stop layer(s) (not shown) may be disposed between the dielectric layer 19 and the dielectric layer 17, and/or between any other two adjacent dielectric layers in the interconnection structure 50.

The conductive contacts 18 penetrate through the dielectric layers 19 and 17 to be electrically connected to the source/drain regions 14 of the transistors 15. The conductive contacts 20 penetrate through the dielectric layer 19 to be electrically connected to the gate electrode 12. In some embodiments, the conductive contact 18 may also be referred to as source/drain contacts, and the conductive contact 20 may also be referred to as gate contact.

The dielectric layers 100, 108, 110, 120 are disposed over the ILDs 19 and 17 and may also be referred to as IMDs. The conductive lines 21 may be embedded in the dielectric layer 100 and electrically connect to source/drain regions 14 and the gate electrode 12 through the conductive contacts 18 and 20, respectively. The conductive vias 22 are disposed in the dielectric layer 110 and provide electrical connection between the conductive lines 21 and overlying conductive lines 101c.

In some embodiments, the memory device 280 includes a memory cell MC that is disposed on the top surface of the dielectric layer 110 and embedded in the dielectric layers 108, 110 and 120. The dielectric layer 100 may also be referred to as a base dielectric layer or a buffer dielectric layer configured for forming a memory device thereon. In some embodiments, the memory cell MC includes a transistor 106 and a data storage structure 118 electrically connected to the transistor 106. The transistor 106 includes a channel layer 102, a gate dielectric layer 103, a gate 104, and source/drains 101a. In some embodiments, the transistor 106 may also be referred to as a thin-film-transistor (TFT). In some embodiments, the channel layer 102 includes a metal oxide, oxide semiconductor, or a combination thereof. The material of the channel layer 102 may be or include amorphous indium gallium zinc oxide (IGZO), indium zinc oxide (IZO), indium gallium oxide, other applicable materials, or combinations thereof.

The gate dielectric layer 103 may include silicon dioxide ($SiO_2$), aluminum oxide ($Al_2O_3$), silicon oxide, silicon nitride, silicon oxynitride, a high-K dielectric material, or the like, or combinations thereof. The high-k dielectric material may have a dielectric constant such as greater than about 4, or greater than about 7 or 10. In some embodiments, the high-k dielectric material includes $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or other applicable insulating materials, or combinations thereof. The material of the gate dielectric layer 103 may be the same as or different from the material of the gate dielectric layer 11.

The gate 104 may include molybdenum (Mo), gold (Au), titanium (Ti), or other applicable metallic materials, or combinations thereof. The source/drains 101a may include a conductive material, such as metal, metal alloy or a combination thereof. For example, the conductive material of the source/drains 101 may include copper, molybdenum (Mo), gold (Au), titanium (Ti), or other applicable metallic materials, or a combination thereof. In some embodiments, the source/drains 101a may be free of semiconductor materials.

In some embodiments, the channel layer 102 and the source/drains 101a are disposed on and in physical contact with the top surface of the dielectric layer 100. The bottom surfaces of the channel layer 102 and the source/drains 101a may be substantially coplanar with the bottom surface of the dielectric layer 108. In some embodiments, the channel layer 102 covers portions of the top surfaces and facing sidewalls of the source/drains 101a. Herein, the "facing sidewalls" of the source/drains 101a refer to the sidewalls of the source/drains 101a that are facing each other. In other words, the channel layer 102 includes a first portion and a second portion. The first portion of the channel layer 102 is located between and in contact with the facing sidewalls of the source/drains 101a, and the second portion of the channel layer 102 is located on the first portion thereof and covers portions of the top surfaces of the source/drains 101a. In other words, the corners of the source/drains 101a that are facing each other are covered by the channel layer 102. It should be understood that one of the source/drains 101a serves as the source of the transistor 106, and the other one of the source/drains 101a serves as the drain of the transistor 106. For example, the left one of source/drains 101a serves as the source, while the right one of the source/drains 101a serves as the drain, or vice versa.

The gate dielectric layer 103 is sandwiched between the channel layer 102 and the gate 104 to separate the channel layer 102 and the gate 104. In some embodiments, the sidewalls of the gate 104, the gate dielectric layer 103 and the channel layer 102 are substantially aligned with each other. In other words, the gate 104 and the gate dielectric layer 103 may overlap portions of the source/drains 101a.

The conductive vias 109a and 109b are landing on and electrically connected to the source/drains 101a and the gate 104, respectively. In some embodiments, the conductive vias 109a may also be referred to as source/drain contacts, and the conductive via 109b may also be referred to as gate contact. In some embodiments, the transistor 106, and the conductive vias 109a and 109b of the memory cell MC are embedded in the dielectric layer 108.

The dielectric layer 110 is disposed on the dielectric layer 108, and the data storage structure 118 may be embedded in the dielectric layer 110 and electrically connected to the gate 104 of the transistor 106 through the conductive via 109b. The data storage structure 118 may be or include a capacitor, such as a ferroelectric capacitor. For example, the data storage structure 118 may include a first electrode 112, a storage layer 114 and a second electrode 116. The materials of the first electrode 112 and the second electrode 116 may respectively be or include aluminum (Al), titanium (Ti), copper (Cu), tungsten (W), platinum (Pt), palladium (Pd), osmium (Os), ruthenium (Ru), tantalum (Ta), or an alloy thereof, titanium nitride (TiN), tantalum nitride (TaN), tungsten nitride (WN), molybdenum nitride (MoN), TaSiN, TiSiN, WSiN, tungsten silicide, titanium silicide, cobalt silicide, zirconium silicide, platinum silicide, molybdenum silicide, copper silicide, nickel silicide, indium tin oxide (ITO), iridium oxide ($IrO_2$), rhenium oxide ($ReO_2$), rhenium trioxide ($ReO_3$), or combinations thereof.

In some embodiments, the storage layer 114 may include a ferroelectric material and may also be referred to as a ferroelectric layer. A ferroelectric material has a nonlinear relationship between the applied electric field and the stored charge. Specifically, the ferroelectric characteristic has the form of a hysteresis loop. Semi-permanent electric dipoles are formed in the crystal structure of the ferroelectric material. When an external electric field is applied across the ferroelectric material, the dipoles tend to align themselves with the field direction, produced by small shifts in the positions of atoms and shifts in the distributions of electronic charge in the crystal structure. When the external electric field is removed, the dipoles of the ferroelectric material retain their polarization state.

The ferroelectric material may include hafnium oxide ($HfO_x$) doped with dopant(s) such as Zr, Si, La, hafnium zirconium oxide (HZO), AlScN, $ZrO_x$, $ZrO_xPb_3Ge_5O_{11}$ (PGO), lead zirconatetitanate (PZT), $SrBi_2Ta_2O_9$(SBT or SBTO), $SrB_4O_7$(SBO), $Sr_aBi_bTa_cNb_dO_x$(SBTN), $SrTiO_3$ (STO), $BaTiO_3$ (BTO), $(Bi_xLa_y)Ti_3O_{12}$(BLT), $LaNiO_3$ (LNO), $YMnO_3$, $ZrO_2$, zirconium silicate, ZrAlSiO, hafnium oxide ($HfO_2$), hafnium silicate, HfAlO, LaAlO, lanthanum oxide, $Ta_2O_5$, and/or other suitable ferroelectric material, or combinations thereof. However, the disclosure is not limited thereto. In alternative embodiments, the storage layer 114 may include a dielectric material such as silicon oxide, silicon nitride, silicon oxynitride, an oxide-nitride-oxide (ONO) structure, aluminum oxide, or the like.

In some embodiments, the first electrode 112 is electrically connected to the gate 104 of the transistor 106 through the conductive via 109b. In some embodiments, the first electrode 112 surrounds sidewalls and bottom surfaces of the storage layer 114 and the second electrode 116. The first electrode 112 may be U-shaped. The storage layer 114 is sandwiched between and separates the first electrode 112 and the second electrode 116. The storage layer 114 may also be U-shaped and surrounds sidewalls and bottom surface of the second electrode 116.

In some embodiments, conductive vias 122a penetrate through the dielectric layers 120 and 110 to electrically connect to the conductive vias 109a and further connect to the source/drains 101a of the transistor 106 through the conductive vias 109a. In some embodiments, a conducive via 122b is disposed in the dielectric layer 120 and electrically connected to the second electrode 116 of the data storage structure 118. The conductive lines 124a are disposed on the dielectric layer 120 and electrically connected to the source/drains 101a of the transistor 106 through the conductive vias 122a and 109a. The conductive line 124b is disposed on the dielectric layer 120 and electrically connected to the second electrode 116 of the data storage structure 118 through the conductive via 122b.

In some embodiments, during the operation of the memory cell MC, the ferroelectric layer 114 is polarized using the first electrode 112 and the second electrode 116 in order to write data (e.g., "0" or "1") in the ferroelectric layer 114. For example, the ferroelectric layer 114 is polarized by the electric field created between the first electrode 112 and the second electrode 116. The polarization state of the ferroelectric layer 114 may affect the threshold voltage Vt of the transistor 106. In some embodiments, when the ferroelectric layer 114 is polarized, the transistor 106 is set to either ON or OFF state according to the polarization state (corresponding to the written data "0" or "1") of the ferroelectric layer 114. Accordingly, the written data "0" or "1" may be read based on the drain current of the transistor 106.

In some embodiments, interconnect wirings (e.g., conductive vias 109c, 122c and conductive lines 101c, 124c) connected to the transistors 15 may also be formed in the dielectric layers 108, 110, 120 and laterally aside the memory cell MC, and some of the interconnect wirings may be formed simultaneously with the conductive features of the memory cell MC. For example, conductive lines 101c and conductive vias 109c may be embedded in the dielectric layer 108 and electrically connected to the conductive lines 21 through the conductive vias 22. In some embodiments, the conductive lines 101c are formed/defined simultaneously with the source/drains 101a, and the conductive vias 109c may be formed/defined simultaneously with the conductive vias 109a. In some embodiments, the top surfaces and bottom surfaces of the conductive lines 101c may be substantially coplanar with the top surfaces and bottom surfaces of the source/drains 101a, respectively. The top surfaces of the conductive vias 109a, 109b and 109c may be substantially coplanar with the top surface of the dielectric layer 108.

The conductive vias 122c may be formed in the dielectric layers 110 and 120 and electrically connected to the conductive vias 109c. The conductive lines 124c are formed on the dielectric layer 120 and electrically connected to conductive vias 122c. In some embodiments, the conductive vias 122c may be formed simultaneously with the conductive vias 122a, and the conductive lines 124c may be formed simultaneously with the conductive lines 124a and 124b.

Still referring to FIG. 1, in some embodiments, the transistors 15 and some interconnect wirings of the interconnection structure 50 may form a logic circuit. The memory cell MC may be embedded in IMDs of the interconnection structure 50, and electrically coupled to the logic circuit including the transistors 15 through the interconnect wirings included in the interconnection structure 50. Although the memory device is shown to be formed on the dielectric layer 100 immediately on the dielectric layer 19, it is merely for illustration, and the disclosure is not limited thereto. The memory device may be embedded in any dielectric layers of the interconnection structure 50 over the first ILD 17, depending on product design and requirement.

FIG. 2A to FIG. 2J are cross-sectional views illustrating a method of forming the memory device of the semiconductor structure 500A according to some embodiments of the disclosure. For the sake of brevity, the components underlying the dielectric layer 100 (such as the substrate 10, the transistors 15, the contacts 18 and 20) and the interconnect wiring (such as the conductive lines 21, 101c, 124c and the conductive vias 22, 109c, 122c) connected to the transistor 15 are not shown in FIG. 2A to FIG. 2J.

Figure 2A:
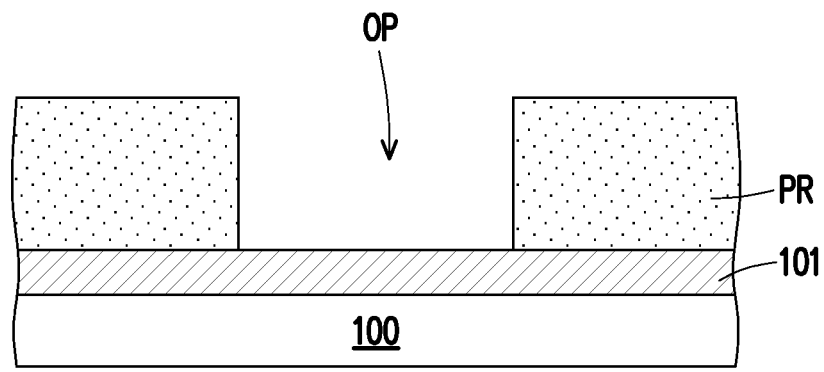
FIG. 2A to FIG. 2J are cross-sectional views illustrating various intermediate stages in the manufacturing of the memory device included in the semiconductor device of FIG. 1, according to some embodiments of the disclosure.

Referring to FIG. 1 and FIG. 2A, in some embodiments, the substrate 10 is provided, the gate structure including the gate dielectric layer 11, the gate electrode 12 and the spacers 13 are formed on the substrate 10 by various suitable technique such as deposition, patterning including photolithograph, etching, and/or the like. The source/drain regions 14 are formed in the substrate 10 and on sides of the gate stack by doping processes, epitaxial process, or combinations thereof. The etching stop layer 16 and the dielectric layer 17 are formed on the substrate 10 and laterally aside the gate stack. In some embodiments, the etching stop layer 16 and the dielectric layer 17 may be formed by forming etching stop material layer and dielectric material layer on the substrate 10 to cover sidewalls and top surfaces of the gate stack by suitable deposition processes, such as chemical vapor deposition (CVD), thereafter, performing a planarization process such as chemical mechanical polishing (CMP) to remove excess portions of the etching stop material layer and the dielectric material layer over the top surface of the gate electrode 12. In some alternative embodiments, the gate electrode 12 is formed after the etching stop layer 16 and the dielectric layer 17 are formed, and the formation of the gate electrode 12 may include a gate replacement process.

Thereafter, the dielectric layer 19 is formed on the dielectric layer 17 and the gate stack. In some embodiments, the dielectric layers 17 and 19 and the etching stop layer 16 are patterned to form contact holes therein by a patterning process, for example, including photolithograph and etching processes, the contact holes expose portions of the source/drain regions and the gate electrode 12. Thereafter, conductive materials are formed on the dielectric layer 19 to fill the contact holes. A planarization process such as CMP is performed to remove excess portions of the conductive materials over the top surface of the dielectric layer 19, and the remained conductive materials in the contact holes constitute the conductive contacts 18 and 20. Thereafter, conductive lines 21 are formed on the dielectric layer 19 to connect to the conductive contacts 18 and 20 by a suitable deposition process such as CVD, physical vapor deposition (PVD) or the like, or combinations thereof, followed by a patterning process such as including photolithograph and etching processes. It is noted that, the above-described processes for forming the transistors 15, the ILDs and the conductive contacts are merely for illustration, and the disclosure is not limited thereto. Other suitable processes may also be applied.

Still referring to FIG. 1 and FIG. 2A, a dielectric layer 100 is formed on the dielectric layer 19. The dielectric layer 100 may be a single-layer structure or a multi-layer structure. The dielectric layer 100 may be formed by CVD, PECVD, FCVD, spin coating or the like or combinations thereof. Conductive vias 22 (not shown in FIG. 2A) are formed in the dielectric layer 100 to connect to the conductive lines 21. The forming method of the conductive vias 22 may be similar to those of the conductive contacts 20.

Referring to FIG. 2A, a conductive material layer 101 is formed on the dielectric layer 100. The conductive material layer 101 may include metal, metal alloy or a combination thereof. For example, the conductive material layer 101 may include copper, molybdenum (Mo), gold (Au), titanium (Ti), or other applicable metallic materials, or a combination thereof. The conductive material layer 101 may be formed by a suitable deposition process such as CVD, PVD, or the like; or a plating process such as electroless plating or electroplating process, or combinations thereof.

Figure 2B:
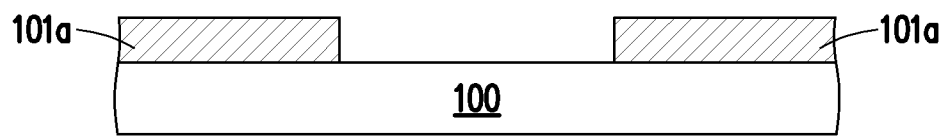

Referring to FIG. 2A and FIG. 2B, the conductive material layer 101 is patterned to form source/drains 101a. The patterning method may include photolithography and etching processes. For example, a patterned mask layer PR may be formed on the conductive material layer 101. The patterned mask layer PR may include a patterned photoresist formed by spin coating and photolithograph. In some embodiments, the patterned mask layer PR has a pattern for defining the source/drains 101a and/or the conductive lines 101c (FIG. 1). In some embodiments, the patterned mask layer PR has an opening OP exposing a portion of the conductive material layer 101. An etching process is then performed using the patterned mask layer PR as an etching mask, so as to remove the portion of the conductive material layer 101 exposed by the patterned mask layer PR. Thereafter, the patterned mask layer PR is removed by an ashing or stripping process, for example. After the patterning process, at least portions of the remained conductive material layer 101 form the source/drains 101a. In some embodiments, the source/drains 101a may also be referred to as source/drain electrodes.

In some embodiments, the conductive lines 101c in FIG. 1 is also formed from the conductive material 101, and the conductive lines 101c and the source/drains 101a may be simultaneously formed by the patterning of the conductive material layer 101. For example, after the etching of the conductive material 101, portions of the remained conductive material layer 101 form the source/drains 101a, and the other portions of the remained conductive material layer 101 form the conductive lines 101c. In other words, the conductive lines 101c and the source/drains 101a may be formed of a same conductive material layer 101 and may be formed simultaneously. However, the disclosure is not limited thereto.

Figure 2C:
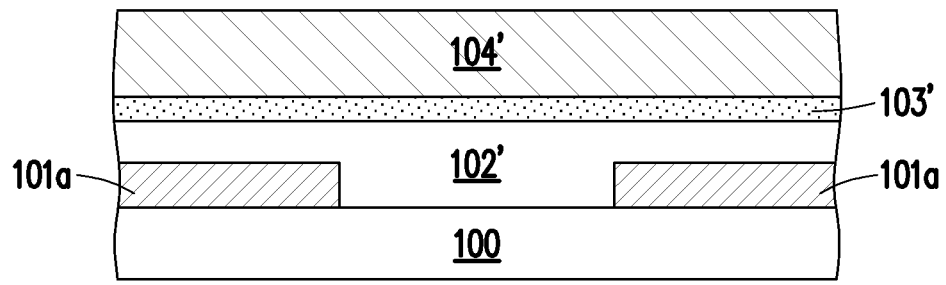

Referring to FIG. 2C, a channel material layer 102', a dielectric layer 103' and a conductive layer 104' are sequentially formed on the dielectric layer 100 to cover the source/drains 101a/101b. In some embodiments, the channel material layer 102', the dielectric layer 103' may be formed by CVD or other suitable deposition process. The conductive layer 104' may be formed by a suitable deposition process such as CVD, PVD, or the like, a plating process such as electro-plating, electroless plating, or combinations thereof. In some embodiments, the conductive layer 104' may be a single metal layer. In some alternative embodiments, the conductive layer 104' may include multiple metal layers.

Figure 2D:
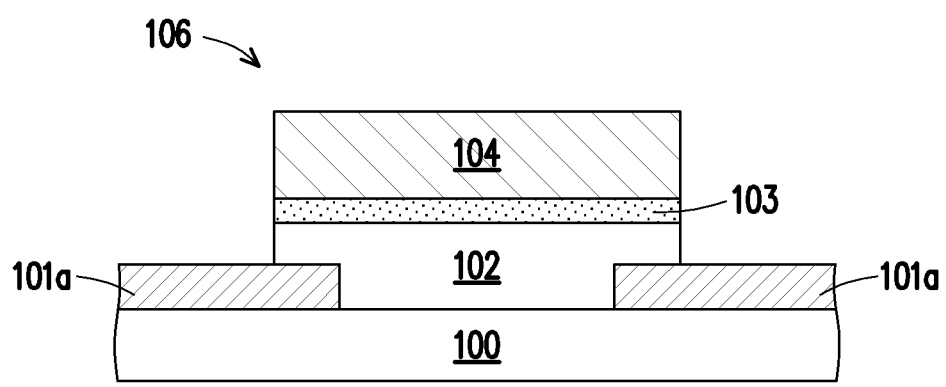

Referring to FIG. 2C and FIG. 2D, the conductive layer 104', the dielectric layer 103', and the channel material layer 102' are patterned to form a channel layer 102, a gate dielectric layer 103 and a gate (or referred to as a gate electrode) 104. The patterning method may include photolithography and etching processes. For example, a patterned mask layer (such as a patterned photoresist) is formed on the conductive layer 104', the patterned mask layer has an opening exposing portions the underlying layers 102'-104'. Thereafter, etching processes are performed using the patterned mask layer as an etching mask, to remove portions of conductive layer 104', the dielectric layer 103' and the channel material layer 102', and the gate 104, the gate dielectric layer 103 and the channel layer 102 are thus formed. Afterwards, the patterned mask layer is removed by ashing or stripping process. As such, the gate 104, the gate dielectric layer 103, the channel layer 102 and the source/drains 101a constitute a transistor 106. The transistor 106 may also be referred to as a thin film transistor.

Figure 2E:
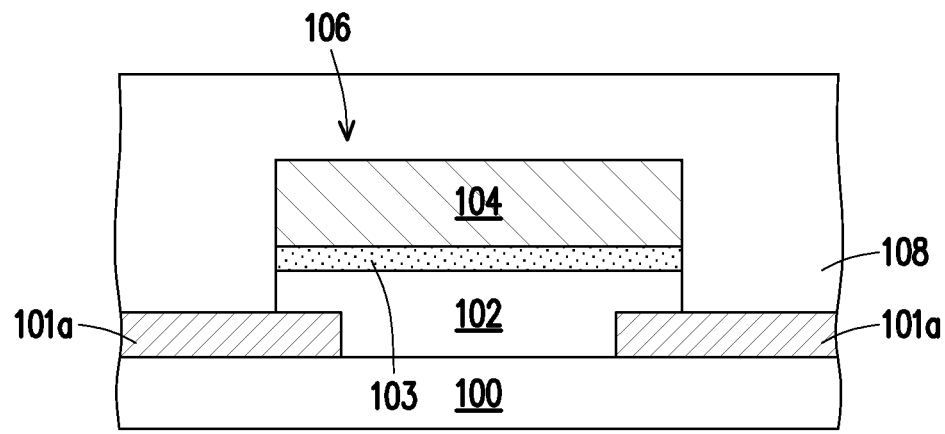

Referring to FIG. 2E, a dielectric layer 108 is formed on the dielectric layer 100 to cover the transistor 106. The material and forming method of the dielectric layer 108 may be selected from the same candidate materials and forming methods of the dielectric layer 100. In some embodiments, the dielectric layer 108 is formed by a deposition process followed by a planarization process (e.g., Chemical mechanical polishing (CMP)). In some embodiments, the dielectric layer 108 may be a single layer formed to have a top surface higher than the top surface of the gate 104. In some alternative embodiments, the dielectric layer 108 may include more than one layer. For example, the dielectric layer 108 may include a first layer laterally aside the transistor 106 and having a top surface substantially coplanar with the top surface of the gate 104; and a second layer disposed on the first layer and the transistor 106.

Figure 2F:
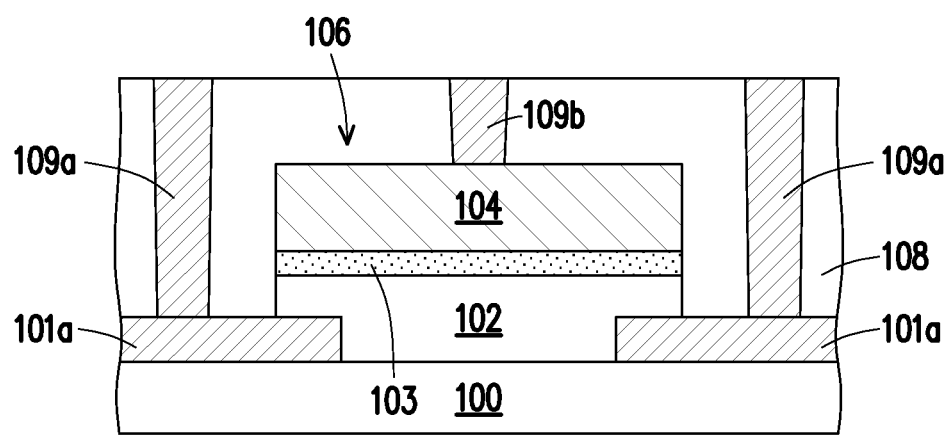

Referring to FIG. 2F, source/drain contacts 109a and gate contact 109b are formed in the dielectric layer 108 to electrically connect to the source/drains 101a and the gate 104 of the transistor 106, respectively. The source/drain contacts 109a penetrate through the dielectric layer 108 and lands on the source/drains 101a. The gate contact 109b penetrates through the dielectric layer 108 and lands on the gate 104. The top surfaces of the source/drain contacts 109a and the gate contact 109b may be substantially coplanar with the top surface of the dielectric layer 108. In some embodiments, the contacts 109a and 109b each include a barrier layer (not shown) and a conductive layer (not shown) on the barrier layer. The barrier layer may surround sidewalls and/or bottom surface of the conductive layer. The barrier layer may include titanium, tantalum, titanium nitride, tantalum nitride, manganese nitride or combinations thereof. The conductive layer may include metal, such as tungsten (W), copper (Cu), Ru, Jr, Ni, Os, Rh, Al, Mo, Co, alloys thereof, combinations thereof or any metallic material with suitable resistance and gap-fill capability.

In some embodiments, the source/drain contacts 109a and the gate contact 109b are formed separately. For example, after the dielectric layer 108 is formed, a first patterned mask (not shown) is formed on the dielectric layer 108. The first patterned mask has openings directly over the source/drains 101a for defining contact holes of the source/drain contacts 109a. An etching process is performed using the first patterned mask as an etching mask to remove portions of the dielectric layer 108 exposed by the first patterned mask, so as to form contact holes for the source/drain contacts 109a. Thereafter, conductive material layers (e.g., barrier material layer and conductive material layer) are formed on the dielectric layer 108 and filling in the contact holes. A planarization process is then performed to remove excess portions of the conductive material layers outside the contact holes. The remained contact materials in the contact holes form the source/drain contacts 109a. It some embodiments, during the formation of the source/drain contacts 109a, conductive vias 109c (FIG. 1) are simultaneously formed in the dielectric layer 108 and landing on the conductive lines 101c. After the source/drain contacts 109a and/or conductive vias 109c are formed, the first patterned mask is removed by an ashing or stripping process, and the gate contact 109b is formed by a method similar to that of the source/drain contacts 109a. For example, a second patterned mask is formed on the dielectric layer 108. The second patterned mask has an opening directly over the gate 104 for defining a contact hole of the gate contact. An etching process is formed to remove a portion of the dielectric layer 108 exposed by the second patterned mask, so as to form a gate contact hole. Thereafter, gate contact 109b is formed within the gate contact hole by the process similar to those described with respect to the source/drain contacts 109a.

Figure 2G:
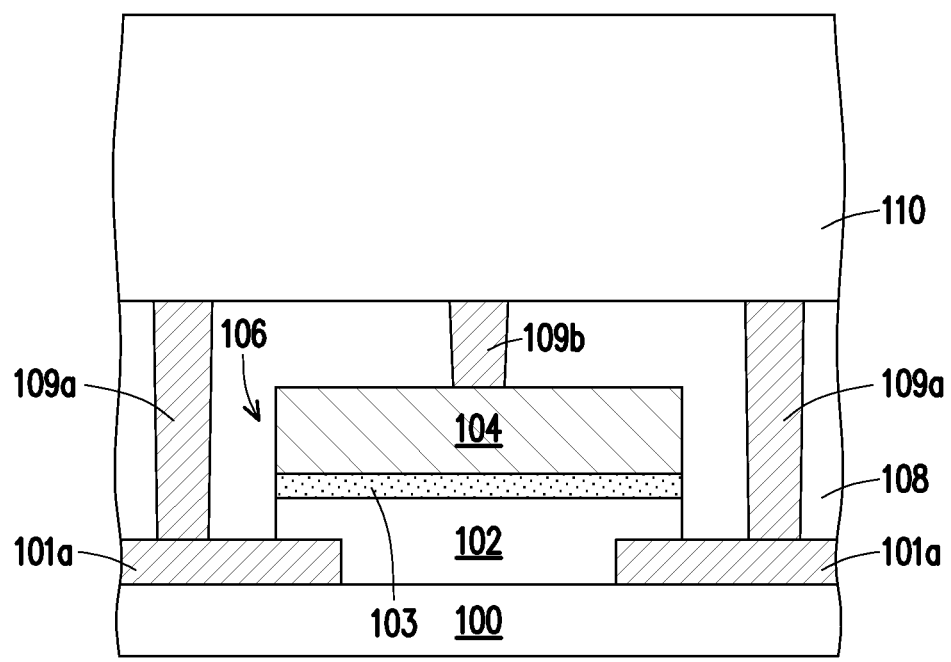

Referring to FIG. 2G, a dielectric layer 110 is then formed on the dielectric layer 108. The material and forming method of the dielectric layer 110 may be selected from the same candidate material and forming method of the dielectric layer 108, which are not described again here.

Figure 2H:
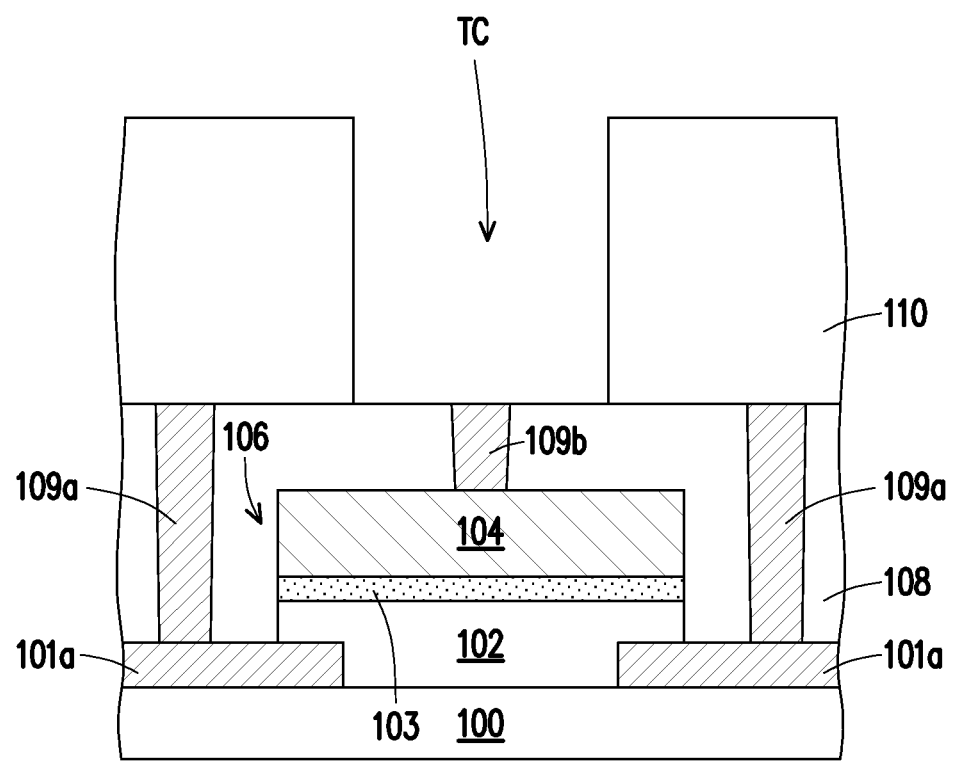

Referring to FIG. 2H, the dielectric layer 110 is patterned to form an opening, such as a trench TC. In some embodiments, the trench TC is directly over the transistor 106 and may expose the top surface of the gate contact 109b and a portion of the top surface of the dielectric layer 108. The dielectric layer 110 may be patterned by photolithograph and etching processes. For example, a patterned mask layer (not shown) is formed on the dielectric layer 110. The patterned mask layer has an opening for defining the trench TC. An etching process is performed to remove a portion of dielectric layer 110 exposed by the patterned mask layer. In other words, the opening of the patterned mask layer is transfers into the dielectric layer 110. Thereafter, the patterned mask layer is removed by an ashing or stripping process.

Figure 2I:
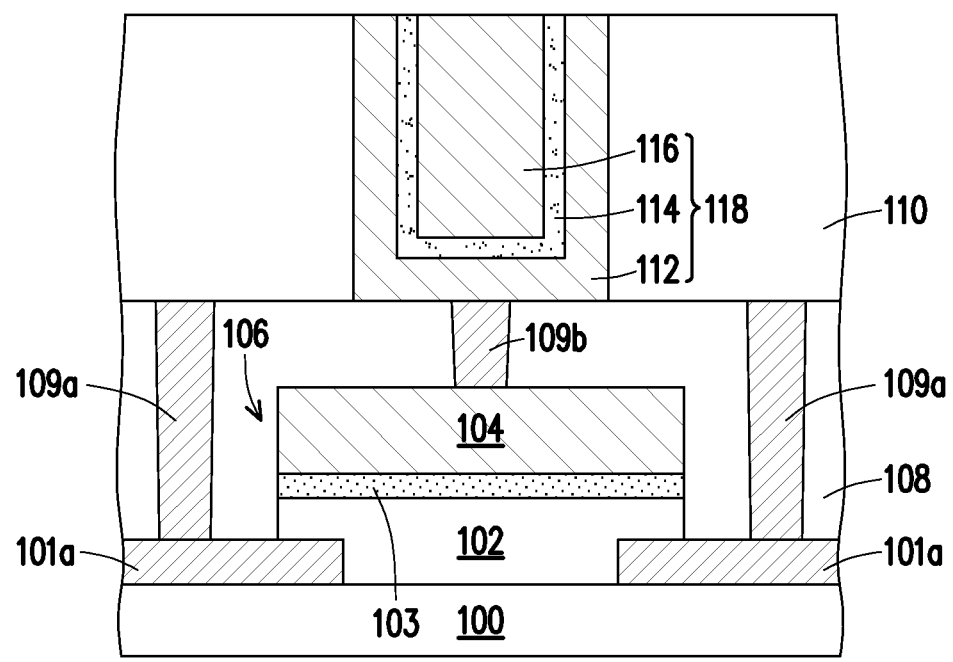

Referring to FIG. 2H and FIG. 2I, a data storage structure 118 is formed in the trench TC of the dielectric layer 110 and electrically coupled to the transistor 106. In some embodiments, the data storage structure 118 includes a first electrode 112, a storage layer 114, and a second electrode 116. The first electrode 112 may also be referred to as a lower electrode or a bottom electrode, and the second electrode 116 may also be referred to as an upper electrode or a top electrode.

In some embodiments, the formation of the data storage structure 118 includes the following processes: after the trench TC is formed in the dielectric layer 110, a first electrode material, a storage material such as a ferroelectric material and a second electrode material are sequentially formed on the dielectric layer 110 and filling the trench TC by, for example, suitable deposition processes such as CVD, PVD, atomic layer deposition (ALD), or the like or combinations thereof. Thereafter, a planarization process (e.g., CMP) is performed to remove excess portions of the first electrode material, the ferroelectric material and the second electrode material over the top surface of the dielectric layer 110, and the first and second electrode materials and ferroelectric material remained in the trench TC constitute the data storage structure 118. In some embodiments, the top surfaces of the first electrode 112, the data storage layer 114 and the second electrode 116 are substantially coplanar with the top surface of the dielectric layer 110.

Figure 2J:
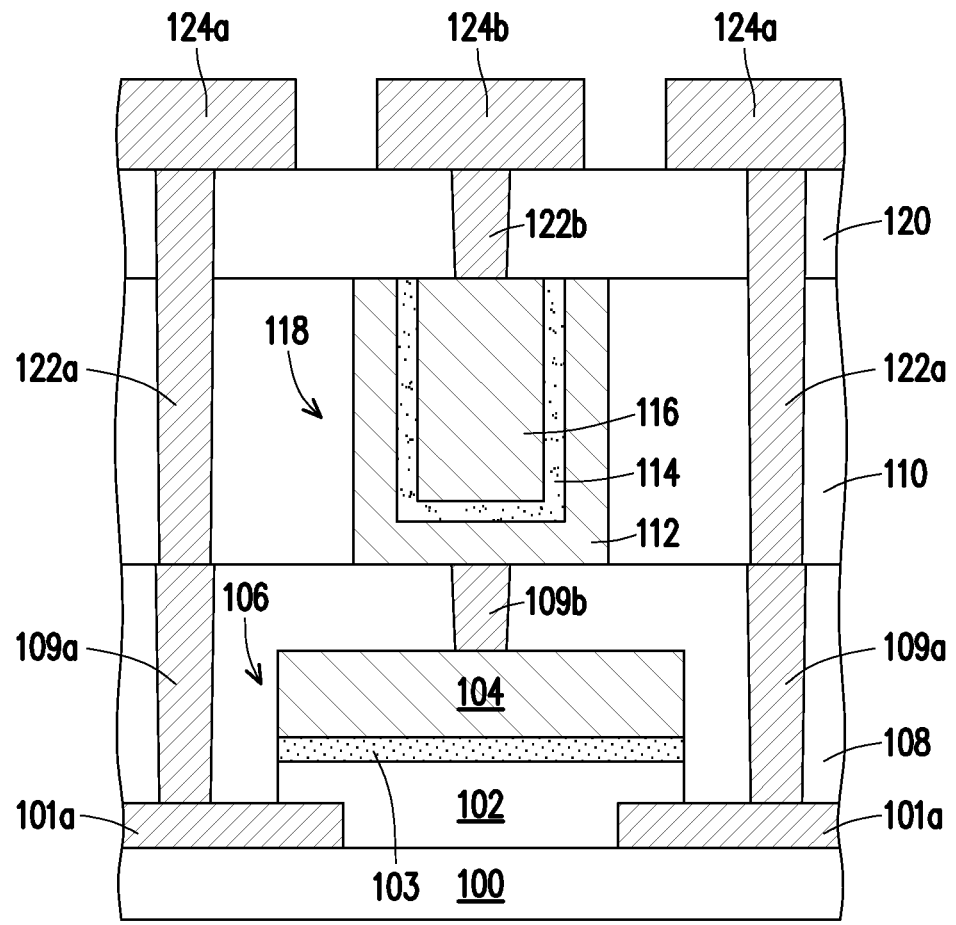

Referring to FIG. 2J, the dielectric layer 120 is then formed on the dielectric layer 110 and the data storage structure 118. Conductive vias 122a are formed in the dielectric layers 120 and 110 to electrically connect to the source/drain contacts 109a. A conductive via 122b is formed in the dielectric layer 120 to electrically connect to the second electrode 116 of the data storage structure 118. The materials and forming method of the conductive vias 122a and 122b are similar to those described with respect to the contacts 109a and 109b. In some embodiments, during the formation of the conductive vias 122a, conductive vias 122c (FIG. 1) are simultaneously formed in the dielectric layers 120 and 110 to electrically connect to the conductive vias 109c. In some embodiments, the top surfaces of the conductive vias 122a, 122b are substantially coplanar with the top surface of the dielectric layer 120.

Thereafter, conductive lines 124a and 124c are formed on the dielectric layer 120 to electrically connect to the conductive vias 122a and 122c, respectively. In some embodiments, during the formation of the conductive lines 124a and 124c, conductive lines 124b (FIG. 1) are simultaneously formed on the dielectric layer 120 to electrically connect to the conductive vias 122c. In some embodiments, the conductive lines 124a-124c are formed by forming a conductive material layer on the dielectric layer 120 through a suitable deposition process (e.g., CVD, PVD), followed by performing a patterning process to pattern the conductive material layer.

In some embodiments, after the conductive lines 124a-124c are formed, one or more dielectric layer and conductive features including conductive vias and/or conductive lines (not shown) are further formed over the dielectric layer 120 and the conductive lines 124a-124b.

Figure 3A:
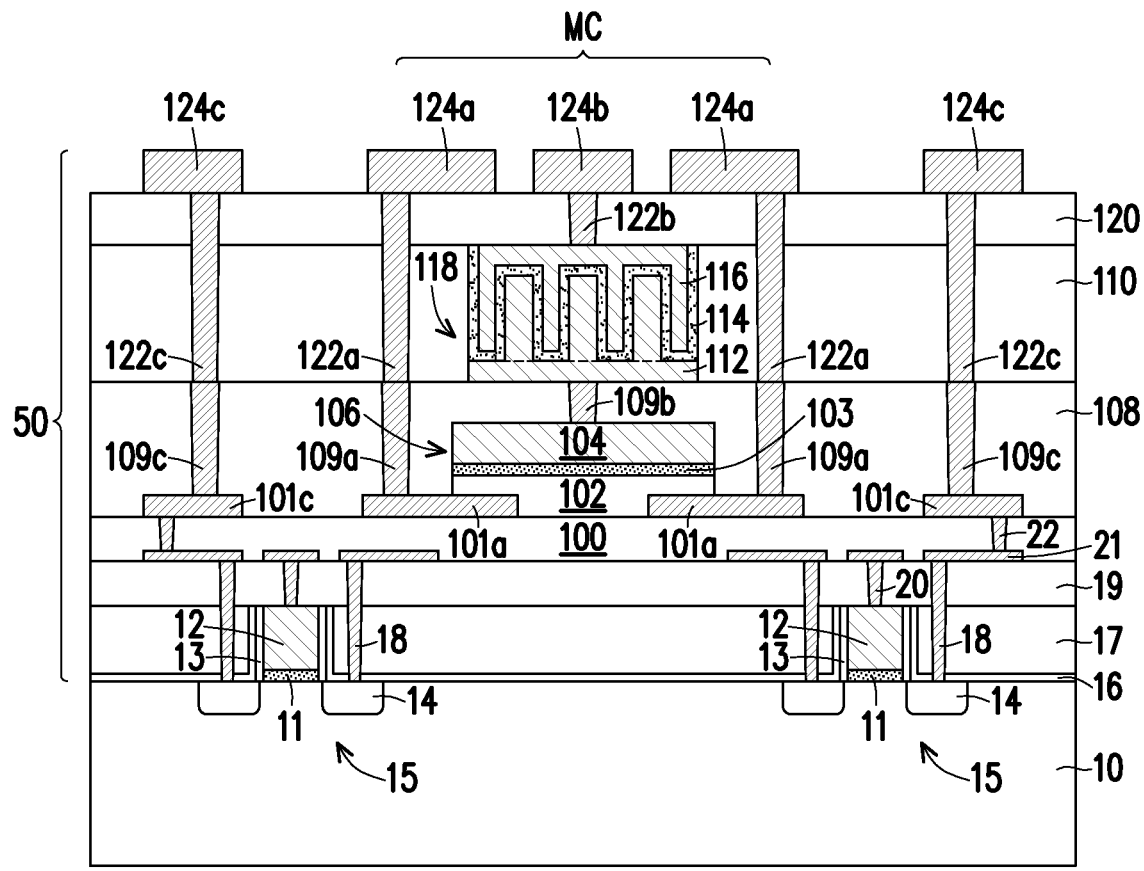
FIG. 3A is a cross-sectional view illustrating a semiconductor structure having a memory device according to some embodiments of the disclosure.
Figure 3B:
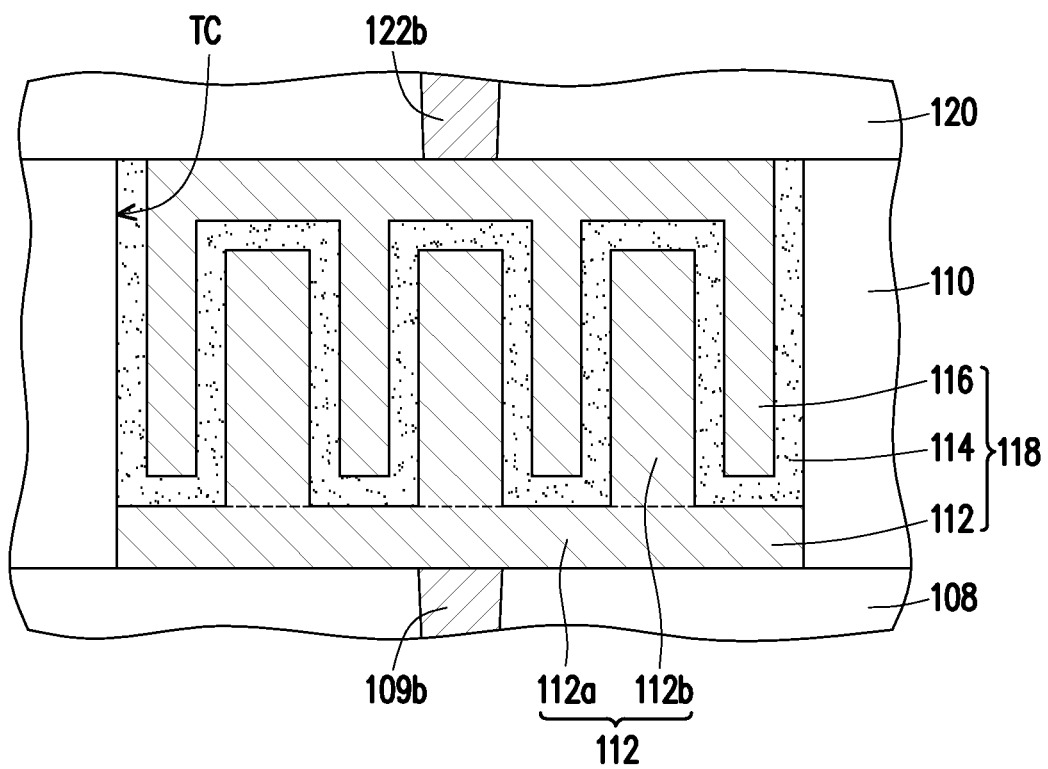
FIG. 3B is an enlarged cross-sectional view illustrating a data storage structure of the memory device in FIG. 3A.

FIG. 3A is a cross-sectional view illustrating a semiconductor structure according to some other embodiments of the disclosure. FIG. 3B is an enlarged view of FIG. 3A illustrating a data storage structure of the semiconductor structure.

Referring to FIG. 3A, a semiconductor structure 500B is illustrated, the semiconductor structure 500B is similar to the semiconductor structure 500A, except that the data storage structure of the semiconductor structure 500B has a different configuration. In some embodiments, the shape of the data storage structure 118 in FIG. 3A is different from those described in FIG. 1.

Referring to FIG. 3A and FIG. 3B, the data storage structure 118 includes the first electrode 112, the second electrode 116 and the storage layer 114 sandwiched therebetween. In some embodiments, the first electrode 112 includes a base portion 112a and a plurality of protruding portions 112b on the base portion 112a. Parts of the base portion 112a not overlaid by the protruding portions 112b may also be referred to as recessed portions of the first electrode 112. The base portion 112a is disposed on and in contact with the dielectric layer 108, and electrically connected to the gate contact 109b. In some embodiments, the base portion 112a has a width substantially equal to a width of the trench TC, and sidewalls of the base portion 112a are in physical contact with the dielectric layer 110. The protruding portions 112b vertically protrude from the top surface of the base portion 112a and are laterally spaced apart from each other and/or laterally spaced apart from the dielectric layer 110. Gaps are existed between the adjacent protruding portions 112b and/or between the protruding portions 112b and the dielectric layer 110. In some embodiments, the sidewalls of the base portion 112a may laterally shift from (e.g., protrude from) sidewalls of the outmost protruding portions 112b that are closest to the dielectric layer 110 among the plurality of protruding portions 112b.

In some embodiments, no visible interface is present between the base portion 112a and the protruding portions 112b. In alternative embodiments, interfaces are existed between the base portion 112a and the protruding portions 112b. It is noted that, the number of the protruding portions 112b illustrated in the figures is merely for illustration, and the disclosure is not limited thereto. The first electrode 112 may include any suitable number of protruding portions 112b disposed on the base portion 112a.

The storage layer 114 partially fills the gaps between the adjacent protruding portions 112b and the gaps between the protruding portions 112b and the dielectric layer 110. In some embodiments, the storage layer 114 is a conformal layer conformally covering the surfaces of the first electrode 112 and the sidewalls of the dielectric layer 110 defining the trench TC. Herein, a "conformal layer" refers to a layer having a substantially equal thickness extending along a region on which the layer is formed. The storage layer 114 covers the top surface of the base portion 112a that is not covered by the protruding portions 112b, sidewalls and top surfaces of the protruding portions 112b, and portions of sidewalls of the dielectric layer 110. In some embodiments, the outmost surface (sidewalls) of the storage layer 114 is substantially aligned with the sidewalls of the base portion 112a and in physical contact with the dielectric layer 110.

The second electrode 116 is disposed on and covers the storage layer 114, filling the remaining space of the trench TC that is not filled by the first electrode 112 and the storage layer 114. The second electrode 116 is separated from the first electrode 112 by the storage layer 114 therebetween. In some embodiments, the second electrode 116 is engaged with the first electrode 112 having the storage layer 114 covering thereon. For example, portions of the second electrode 116 fill into the gaps between the protruding portions 112b and the dielectric layer 110, portions of the second electrode 116 fill into the gaps between the adjacent protruding portions 112b, and the other portions of the second electrode 116 overlay the storage layer 114 and the first electrode 112 and are laterally surrounded by the storage layer 114. In the present embodiments, the second electrode 116 is separated from the dielectric layer 110 by the storage layer 114. In some embodiments, the top surface of the storage layer 114 and the top surface of the second electrode 116 may be substantially coplanar with the top surface of the dielectric layer 110. The top surface (e.g., topmost surface) of the first electrode 112 is overlaid by the storage layer 114 and the second electrode 116 and lower than the top surface of the dielectric layer 110.

In the present embodiments, portions of the storage layer 114 are located on the base portion 112a of the first electrode 112 and laterally sandwiched between the second electrode 116 and the dielectric layer 110. In other words, the surface area of the storage layer 114 that is in physical contact with the second electrode 116 may be larger than the surface area of the storage layer 116 that is in physical contact with the first electrode 112. The orthographic projection area of the storage layer 116 on the top surface of the dielectric layer 108 may be substantially equal to the orthographic projection area of the first electrode 112 on the top surface of the dielectric layer 108, and may be larger than the orthographic projection area of the second electrode 116 on the top surface of the dielectric layer 108.

FIG. 4A to FIG. 4D are cross-sectional views illustrating a method of forming the data storage structure of the semiconductor structure in FIG. 3A according to some embodiments of the disclosure.

Figure 4A:
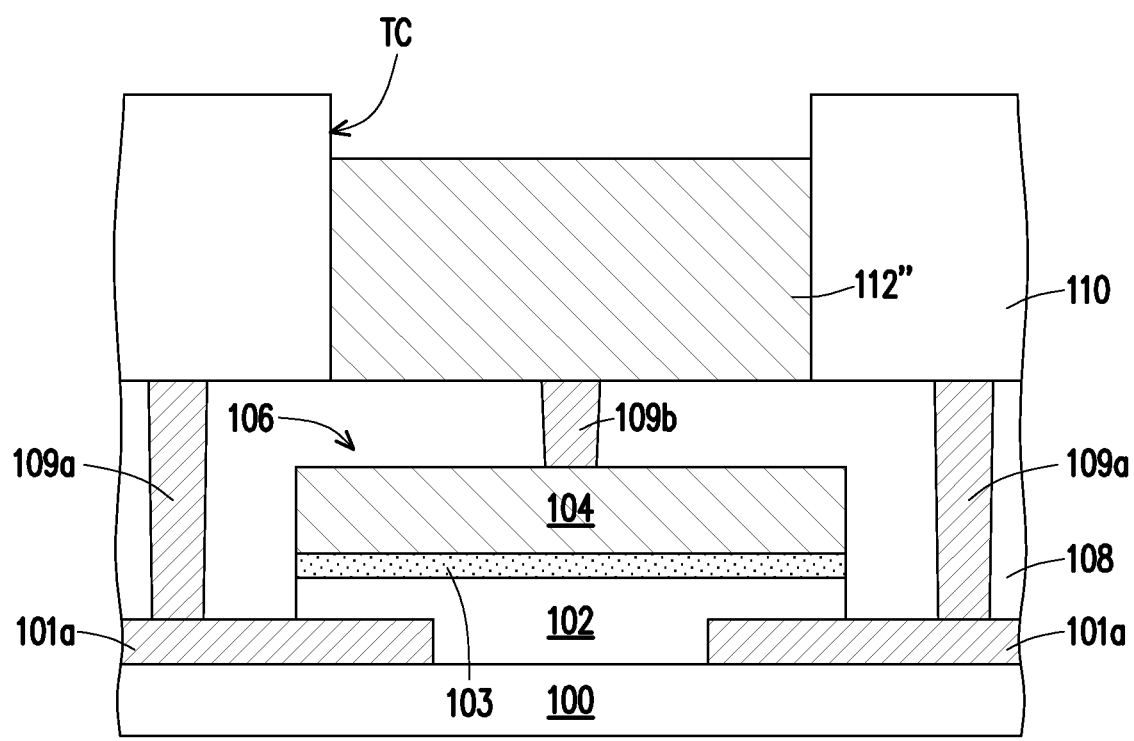
FIG. 4A to FIG. 4D are cross-sectional views illustrating various intermediate stages in the manufacturing of the data storage structure of FIG. 3A, according to some embodiments of the disclosure.

Referring to FIG. 4A, in some embodiments, after a trench TC is formed in the dielectric layer 110, a first electrode material layer 112" is formed to fill the trench TC. In some embodiments, the first electrode material layer 112" is formed to have a top surface lower than the top surface of the dielectric layer 110. The formation of the electrode material 112' may include the following processes: an electrode material is formed on the dielectric layer 110 to fill the trench TC by a suitable deposition process such as CVD, a planarization process such as CMP is then performed to remove excess portions of the electrode material outside the trench TC; after the planarization process is performed, the electrode material may substantially fill up the trench TC and has a top surface substantially coplanar with the top surface of the dielectric layer 110. Thereafter, an etch back process is further performed to remove a portion of the electrode material in the trench TC, such that the top surface of the resulted electrode material 112" is lower than the top surface of the dielectric layer 110. The etch back process may also be referred to as a recessing process.

Figure 4B:
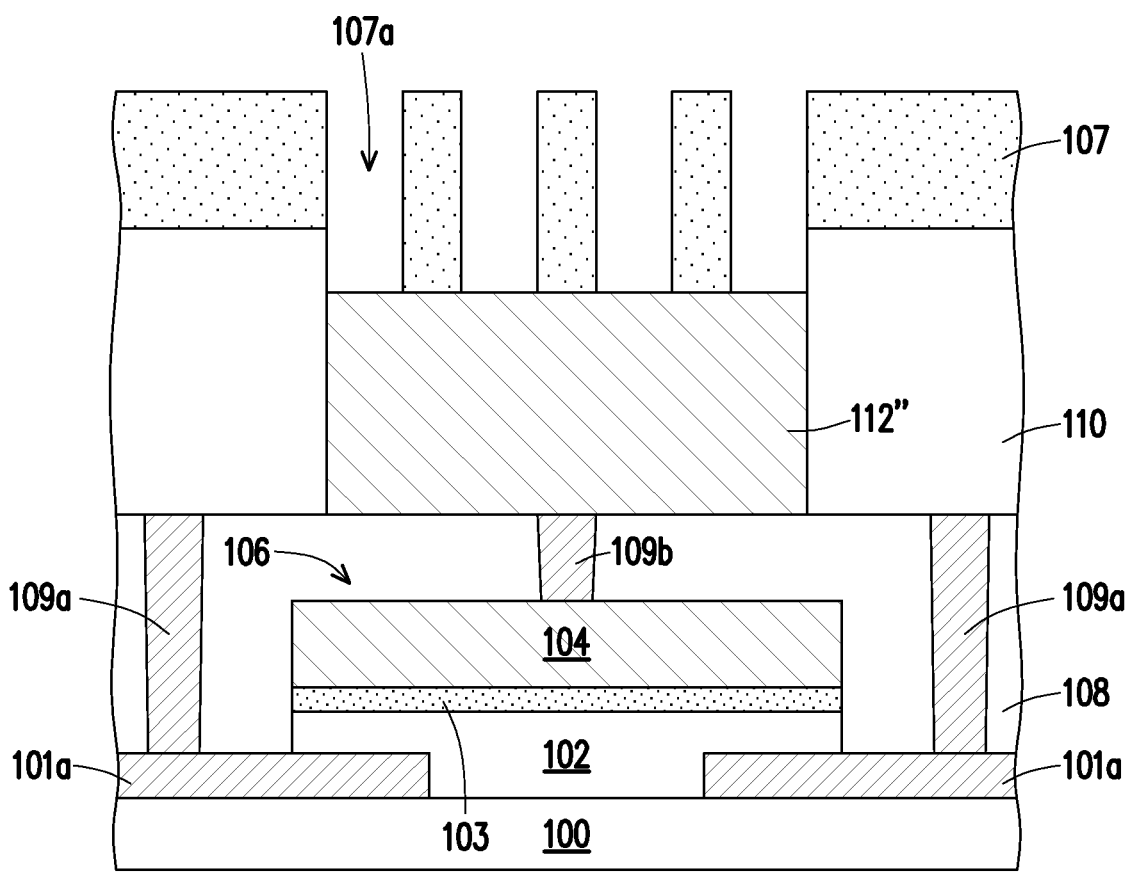
Figure 4C:
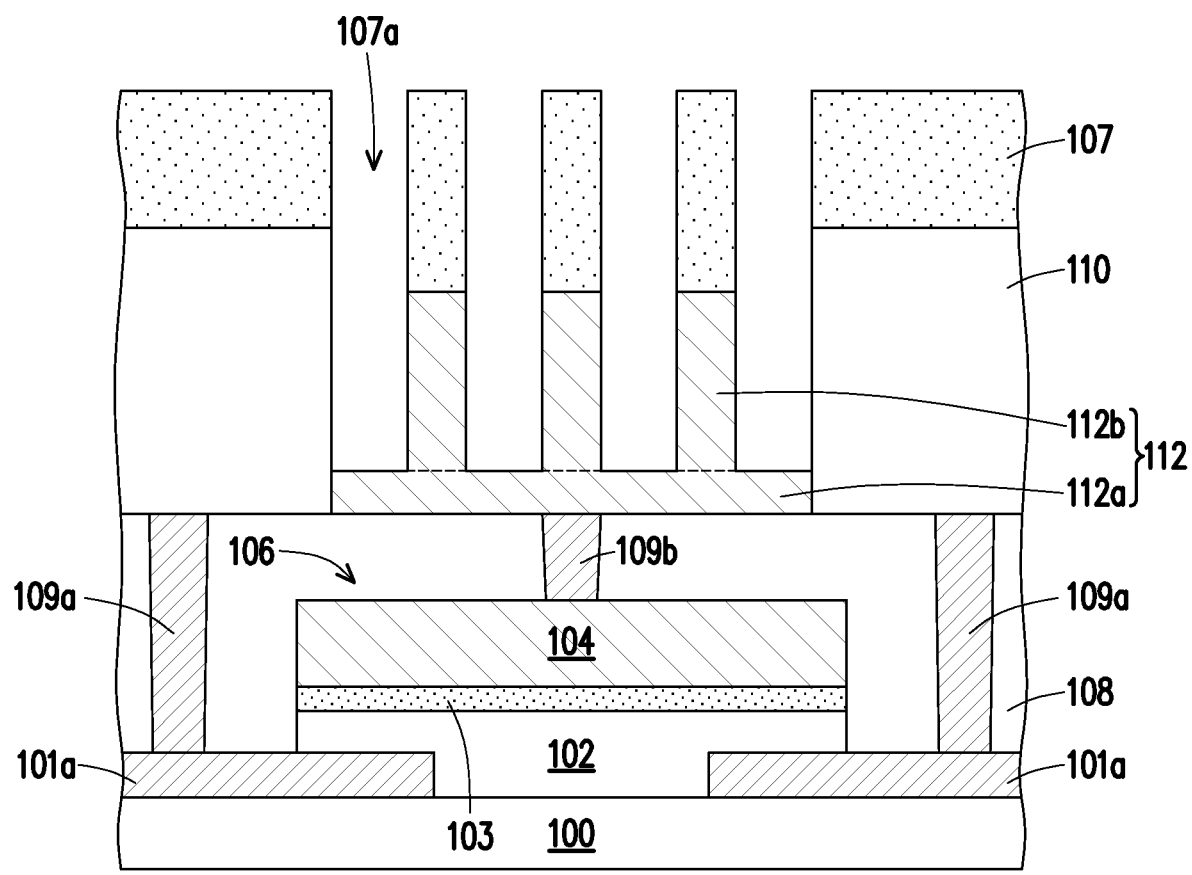

Referring to FIG. 4B, a patterned mask layer 107 is formed on the dielectric layer 110 and the first electrode material layer 112". The patterned mask layer 107 may include a patterned photoresist formed by a photolithography process. The patterned mask layer 107 has a plurality of openings 107a exposing portions of the top surface of the first electrode material layer 112". The openings 107a are used for defining recessed portions of first electrode 112 (FIG. 4C). It some embodiments, the patterned mask layer 107 has at least two openings 107a. It should be understood that the number of the openings 107a shown in FIG. 4B is merely for illustration, and the disclosure is not limited thereto.

Referring to FIG. 4B and FIG. 4C, portions of the first electrode material layer 112" exposed by the openings 107a of the patterned mask layer 107 are recessed. For example, an etching process is performed using the patterned mask layer 107 as an etching mask to remove portions of the first electrode material layer 112" exposed by the openings 107a. The etching process may also be referred to as a recessing process. As such, the remained electrode material layer 112" forms the first electrode 112. In some embodiments, the recessed portions of the electrode material layer 112" and portions of the electrode material layer 112" between the recessed portions form the base portion 112a of the first electrode 112, while the portions of the first electrode material layer 112" previously covered by the patterned mask layer 107 and protruding from the base portion 112a form the protruding portions 112b of the first electrode 112.

Figure 4D:
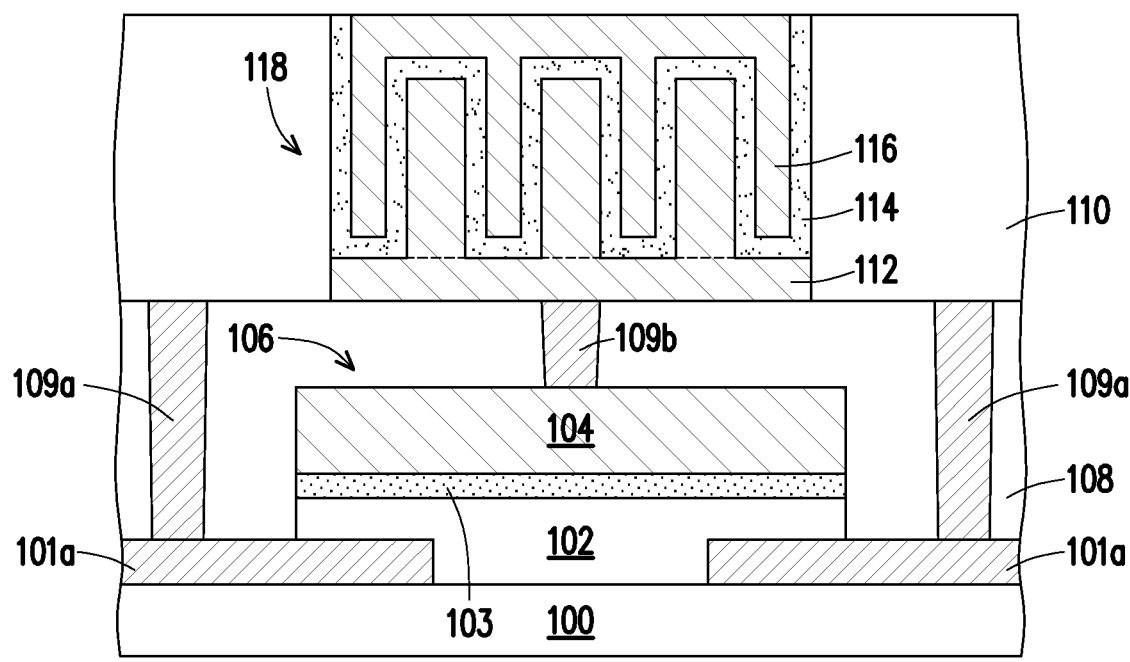

Referring to FIG. 4C and FIG. 4D, after the first electrode 112 is formed, the patterned mask layer 107 is removed by as ashing or stripping process. Thereafter, the storage layer 114 and the second electrode 116 are formed on the first electrode 112 within the trench TC of the dielectric layer 110. In some embodiments, the storage layer 114 and the second electrode 116 may be formed by the following method. A storage material layer and a second electrode material layer are formed on the first electrode 112. In some embodiments, the storage material layer and the second electrode material layer overfill the trench TC and extend over the top surface of the dielectric layer 110. The storage material layer may conformal extends along the surfaces of the first electrode 112, the sidewalls of the trench TC and the top surface of the dielectric layer 110. The second electrode material layer is formed on the storage material layer and fills the remained space of the trench that is not filled by the first electrode and the storage material layer. Thereafter, a planarization process (e.g., CMP) is performed to remove excess portions of the storage material layer and the second electrode material layer over the top surface of the dielectric layer 110, remaining the storage material layer and the second electrode material layer within the trench TC to form the storage layer 114 and the second electrode 116.

Figure 5A:
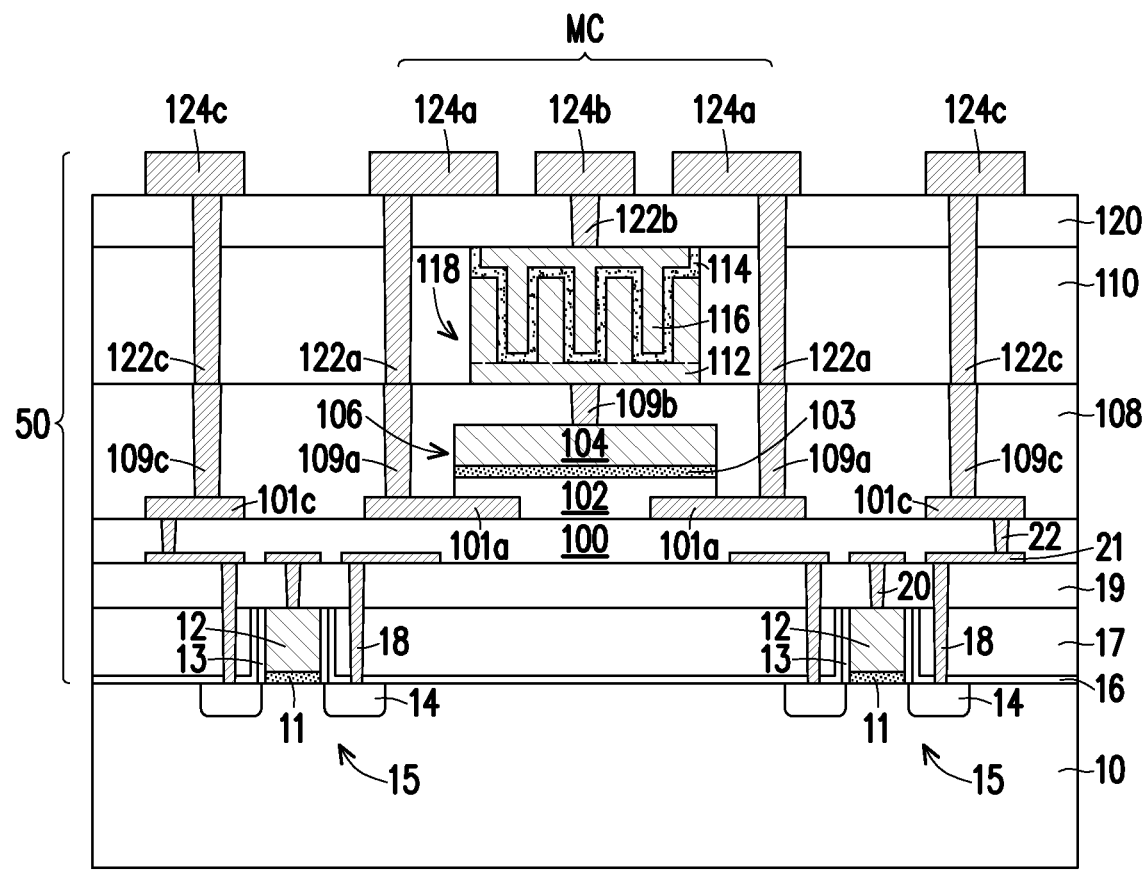
FIG. 5A is a cross-sectional view illustrating a semiconductor structure having memory device according to some embodiments of the disclosure.
Figure 5B:
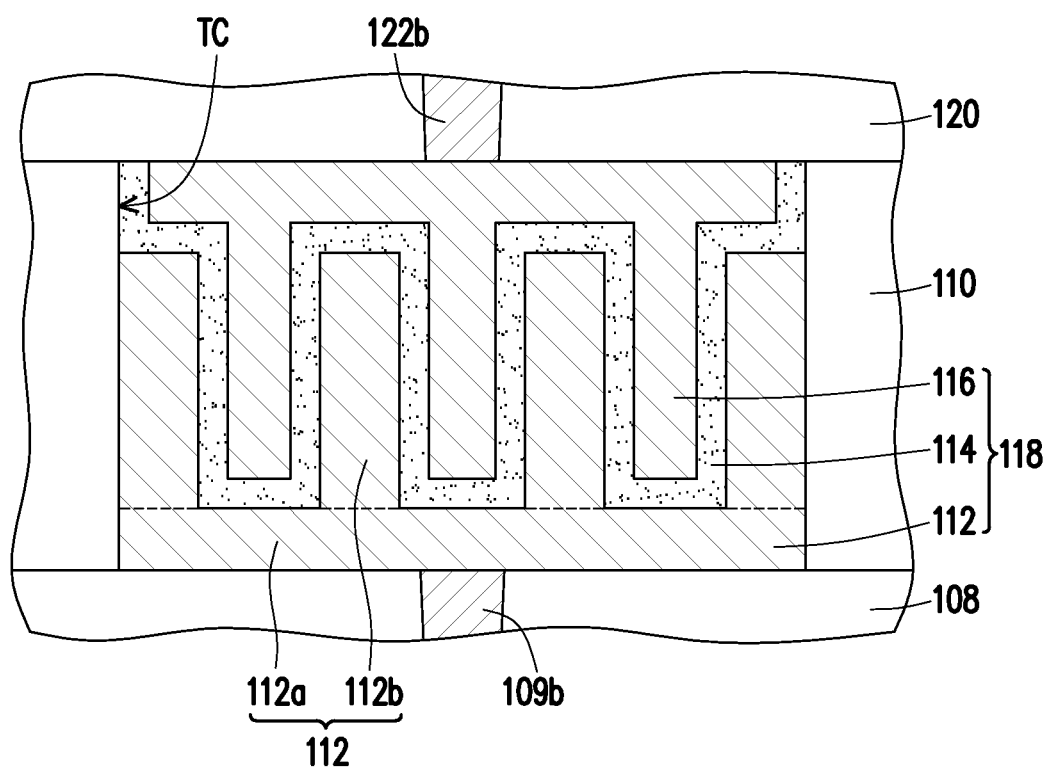
FIG. 5B is an enlarged cross-sectional view illustrating a data storage structure of the memory device in FIG. 5A.

FIG. 5A is a cross-sectional view illustrating a semiconductor structure according to some other embodiments of the disclosure. FIG. 5B is an enlarged view illustrating a data storage structure of the semiconductor structure in FIG. 5A.

Referring to FIG. 5A, a semiconductor structure 500C is illustrated, the semiconductor structure 500C is similar to the semiconductor structure 500B, except the data storage structure 118 is varied slightly. In some embodiments, the data storage structure 118 of the semiconductor structure 500C may be formed by a method similar to those described in FIG. 4A to FIG. 4D, except that the locations of openings 107a of the patterned mask layer 107 are changed, for example, the pattern of the patterned mask layer 107 directly on the electrode material 112" (FIG. 4B) is reversed, such that the locations of resulted recessed portions and protruding portions of the first electrode 112 are exchanged.

Referring to FIG. 5A and FIG. 5B, in some embodiments, both of the base portion 112a and the protruding portion 112b of the first electrode 112 are in contact with the dielectric layer 110, the sidewalls of the protruding parts 112b in contact with the dielectric layer 110 may be substantially aligned with the sidewall of the base portion 112a. In the present embodiment, a portion of the storage layer 114 is located on the protruding portion 112b of the first electrode 112 and laterally sandwiched between the second electrode 116 and the dielectric layer 110. The other structural features of the data storage structure 118 of the semiconductor structure 500C is similar to those of the semiconductor structure 500B described with respect to FIG. 3A and FIG. 3B, which are not described again here.

Figure 6A:
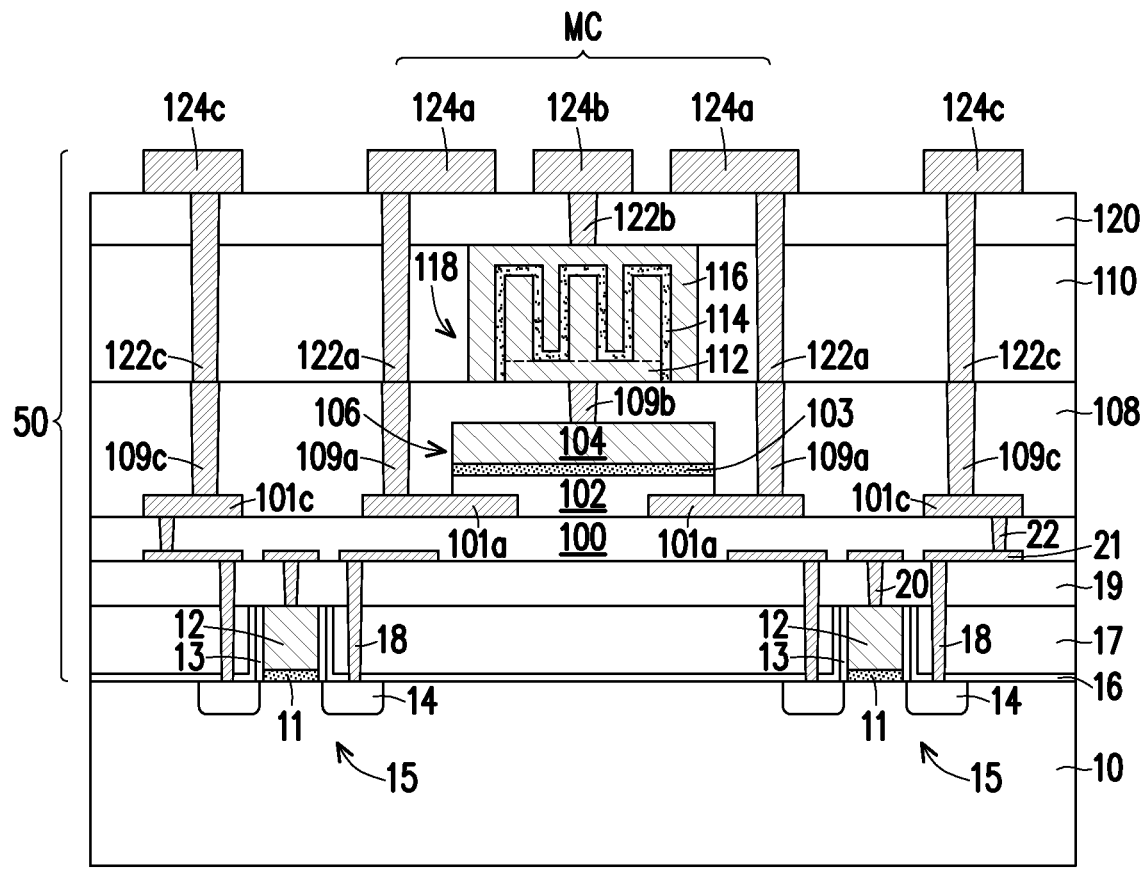
FIG. 6A is a cross-sectional view illustrating a semiconductor structure having memory device according to some embodiments of the disclosure.
Figure 6B:
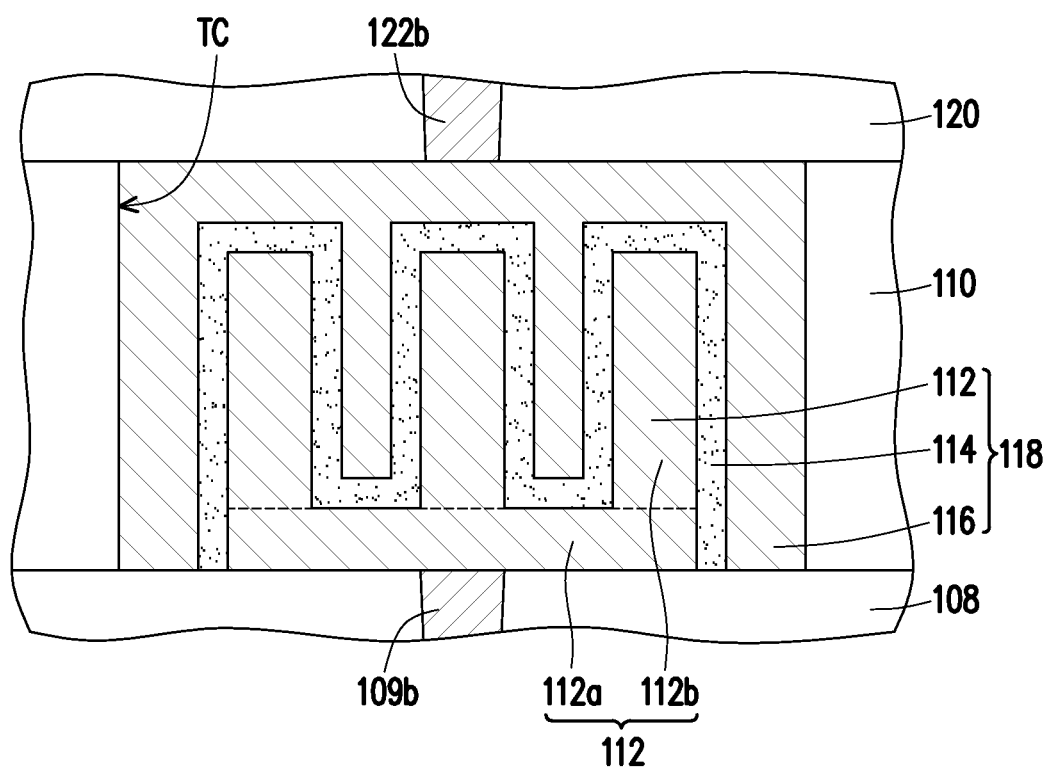
FIG. 6B is an enlarged cross-sectional view illustrating a data storage structure of the memory device in FIG. 6A.

FIG. 6A is a cross-sectional view illustrating a semiconductor structure 500D according to some other embodiments of the disclosure, FIG. 6B is an enlarged view illustrating a data storage structure of the semiconductor structure in FIG. 6A.

Referring to FIG. 6A and FIG. 6B, the semiconductor structure 500D is similar to the semiconductor structure 500B/500C, except that the data storage structure 118 has a different structure. In some embodiments, the base portion 112a of the first electrode 112 has a width less than a width of the trench TC, and sidewalls of the base portion 112a are laterally spaced apart from the dielectric layer 110. The protruding portions 112b of the first electrode 112 vertically protrudes from the top surface of the base portion 112a and are laterally spaced apart from each other and laterally spaced apart from the dielectric layer 110. Gaps are existed between the adjacent protruding portions 112b, and between the base portion 112a and the protruding portion 112b of the first electrode 112 and the dielectric layer 110. In some embodiments, outmost protruding portions 112b, that is, the protruding portions 112b on edges of the base portion 112a may have sidewalls substantially aligned with sidewalls of the base portion 112a. However, the disclosure is not limited thereto.

In some embodiments, the storage layer 114 covers sidewalls of the base portion 112a and a portion of the top surface of the base portion 112a not covered by the protruding portions 112b, sidewalls and top surfaces of the protruding portions 112b of the first electrode 112. In some embodiments, the bottommost surface of the storage layer 114 is substantially coplanar with the bottom surface of the base portion 112a of the first electrode 112 and in physical contact with the top surface of the dielectric layer 108. The storage layer 114 partially fills the gaps between the protruding portions 112b of the first electrode 112 and the gaps between the first electrode 112 and the dielectric layer 110.

In some embodiments, the second electrode 116 is engaged with the first electrode 112 having the storage layer 114 covering thereon. For example, portions of the second electrode 116 are located outside the outmost sidewalls of the first electrode 112 and between the storage layer 114 and the dielectric layer 110, portions of the second electrode 116 overlay the storage layer 114 and the top surface of first electrode 112, and the other portions of the second electrode 116 fills in the gap between the protruding portions 112b. In the present embodiment, the storage layer 114 is separated from the dielectric layer 110 by the second electrode 116.

In some embodiments, the bottommost surface of the second electrode 116, the bottommost surface of the storage layer 114 and the bottommost surface of the first electrode 112 are substantially coplanar with the bottom surface of the dielectric layer 110 and in contact with the top surface of the dielectric layer 108. The sidewalls of the second electrode 116 are in contact with the dielectric layer 110. The top surface of the second electrode 116 may be substantially coplanar with the top surface of the dielectric layer 110. In the present embodiments, the top surfaces of the first electrode 112 and the storage layer 114 are overlaid by the second electrode 116 and lower than the top surface of the dielectric layer 110.

In some embodiments, by using the storage structure 118 of the semiconductor structures 500B-500D shown in FIGS. 3A, 5A, 6A, the coupling area between the first electrode 112 and the second electrode 116 is increased, thereby increasing the capacitance of the storage structure 118.

Figure 7:
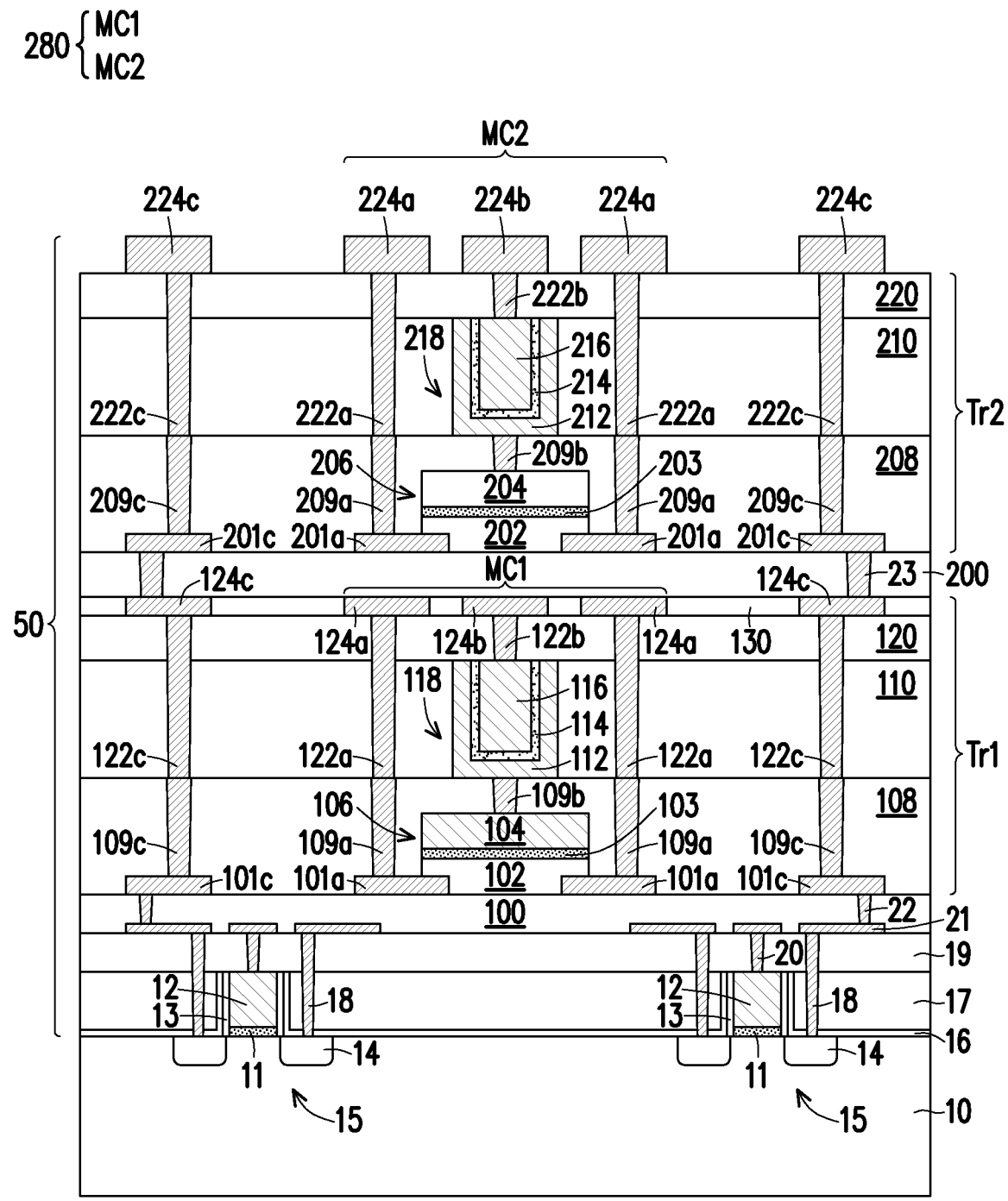
FIG. 7 is a cross-sectional view illustrating a semiconductor structure having memory device according to some embodiments of the disclosure.

FIG. 7 is a cross-sectional view illustrating a semiconductor structure according to some other embodiments of the disclosure.

Referring to FIG. 7, a semiconductor structure 500E is illustrated. In some embodiments, the memory device 280 of the semiconductor structure 500E includes a plurality of memory cells embedded in the interconnection structure 50. For example, two tiers of memory cells are stacked and embedded in the interconnection structure 50. In some embodiments, a first tier Tr1 of memory device is disposed over the transistors 15 over the substrate 10, and a second tier Tr2 of memory device is stacked on the first tier Tr1 of memory device.

It is noted that, some components in the second tier Tr2 of memory devices may be denoted with like-numbers in the first tier Tr1, plus number 100. For example, the transistor in first tier Tr1 is denoted as 106, while the transistor in second tier Tr2 is denoted as 206; the data storage structure in first tier Tr1 is denoted as 118, while the data storage structure in the second tier Tr2 is denoted as 218, and so on. The properties, materials and forming methods of the components in the second tier Tr2 may thus be found in the discussion referring to FIG. 1 to FIG. 2F by referring to the features having the corresponding reference numbers in the first tier Tr1. In addition, although each tier of memory device in shown as including one memory cell, the disclosure is not limited thereto. Any suitable number of memory cells may be included in each tier of memory device, depending on product design and requirement.

In some embodiments, the formation of first tier Tr1 of memory device further includes forming a dielectric layer 130 laterally aside the conductive lines 124a-124c. The top surface of the dielectric layer 130 may be substantially coplanar with the top surfaces of the conductive lines 124a-124c. Thereafter, a dielectric layer 200 is formed on the dielectric layer 130 and the conductive lines 124a-124c, conductive vias 23 may be formed in the dielectric layer 220 to electrically connect to the conductive lines 124c. The dielectric layer 200 may also be referred to as a base dielectric layer or a buffer dielectric layer on which memory structures are to be formed.

In some alternative embodiments, instead of forming the dielectric layer 130 and the dielectric layer 200, a single dielectric layer may be formed on the dielectric layer 120 to cover top surfaces and sidewalls of the conductive lines 124a-124c. Conductive vias 23 may be formed in the single dielectric layer and landing on the conductive lines 124c.

In some embodiments, processes for forming the first tier Tr1 of memory device are repeated to form the second tier Tr2 of memory device. Although two tiers of memory devices are shown in the figures, the disclosure is not limited thereto. Processes for forming the memory device may be repeated for any suitable number of times, so as to form any suitable tiers of memory devices stacked on one another, depending on product design and requirement.

In some embodiments, similar to the first tier Tr1 of memory device, the second tier Tr2 of memory device includes a transistor 206, a data storage structure 218, contacts 209a, 209b, conductive vias 222a, 222b, and conductive lines 224a-224b formed in/on dielectric layers 208, 210 and 220. The transistor 206 includes a gate 204, a gate dielectric layer 203, a channel layer 202, and source/drains 201a. The data storage structure 218 is electrically connected to the transistor 206. In some embodiments, the data storage structure 218 includes a first electrode 212, a storage layer 214 and a second electrode 216. The first electrode 212 is electrically connected to the gate 204 of the transistor 206 through the gate contact 209b. Conductive lines 224a are electrically connected to the source/drains 201a of the transistor 206 through the conductive vias 222a and source/drain contacts 209a. The conductive line 224b is electrically connected to the second electrode 216 of the data storage structure 218 through the conductive via 222b.

In some embodiments, a plurality of conductive vias and/or conductive lines electrically connected to the transistors 15 are also formed in the dielectric layers 208, 210, 220 and laterally aside the memory cell MC2. For example, conductive lines 224c are electrically connected to the conductive lines 124c through the conductive vias 222c and 209c and conductive lines 201c embedded in the dielectric layers 208, 210, 220 and the conductive vias 23 embedded in the dielectric layer 200, and further electrically connected to the transistors 15 through the underlying conductive vias and/or conductive lines.

It is noted that, the data storage structure 118 shown in FIG. 3B, 5B, 6B may also be applied in the first tier Tr1 and/or the second tier Tr2 of memory device of the semiconductor structure 500E.

Figure 8A:
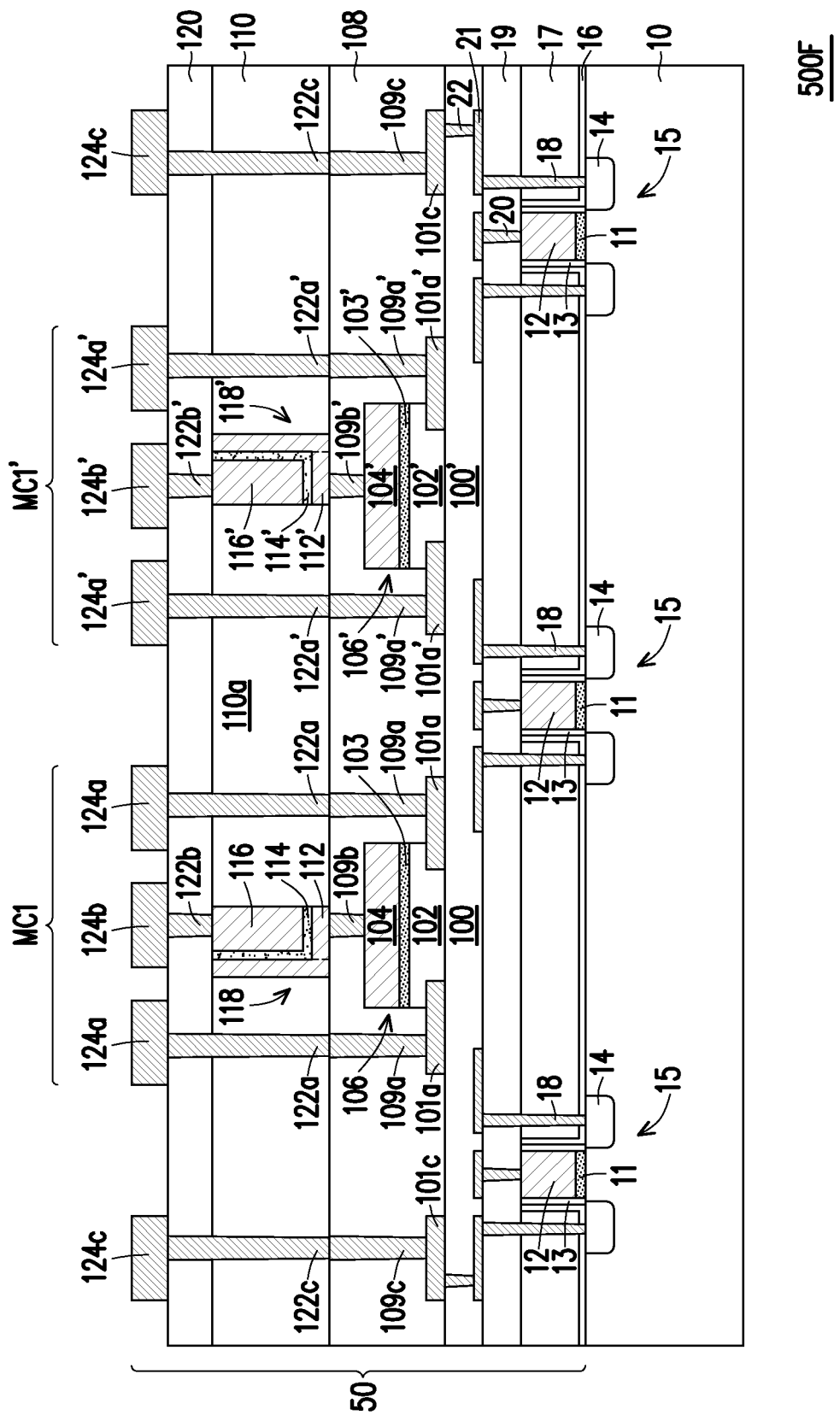
FIG. 8A is a cross-sectional view illustrating a semiconductor structure having memory device according to some embodiments of the disclosure.
Figure 8B:
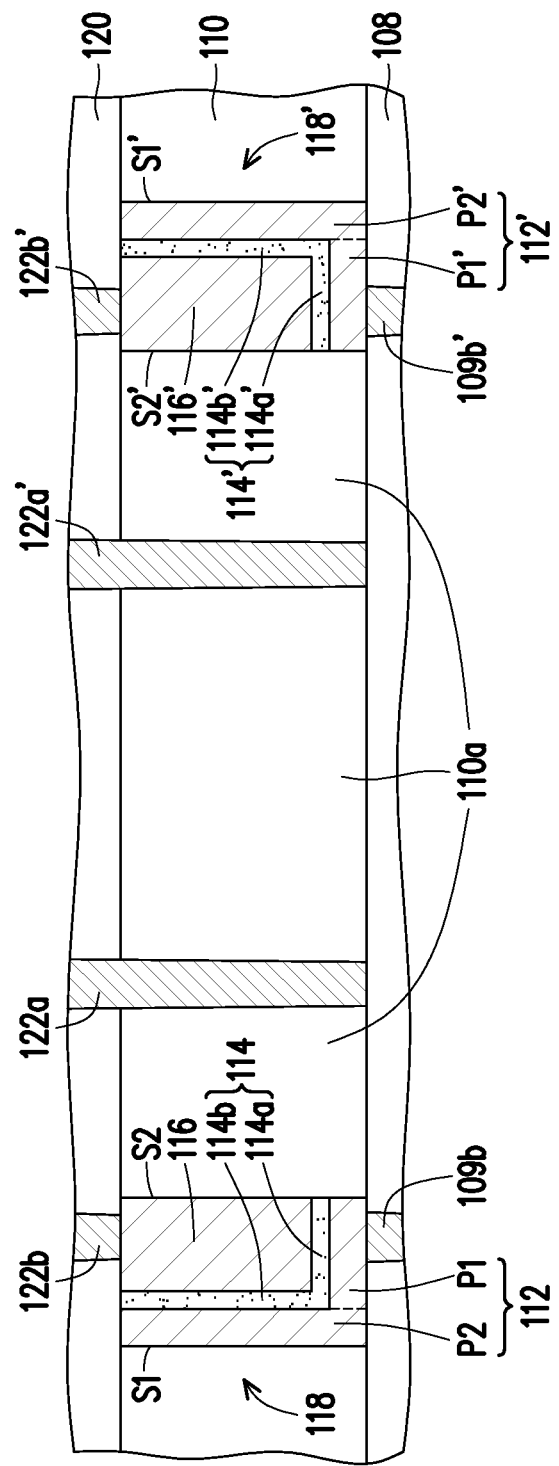
FIG. 8B is an enlarged cross-sectional view illustrating data storage structures of the memory device in FIG. 8A.

FIG. 8A illustrates a semiconductor structure 500F according to some other embodiments of the disclosure. FIG. 8B is an enlarged view illustrating data storage structures of memory cells in FIG. 8A. The semiconductor structure 500F is similar to the semiconductor structure 500A, except that a plurality of memory cells is included in a same tier, and the data storage structure may have different structures.

Referring to FIG. 8A and FIG. 8B, in some embodiments, a plurality of memory cells may be disposed as side by side in a same tier. For example, two memory cells MC1 and MC1' are disposed side by side and embedded in the dielectric layers 108, 110 and 120. It is noted that, the number of the memory cells in a same tier shown in FIG. 8 is merely for illustration, and the disclosure is not limited thereto. The semiconductor structure may include any suitable number of memory cells disposed in a same tier.

In some embodiments, the memory cell MC1 has a structure similar to those described in FIG. 1, except that the data storage structure 118 has a different structure. The data storage structure 118 includes a first electrode 112, a second electrode 116 and a storage layer 114 sandwiched between the first electrode 112 and the second electrode 116. In some embodiments, the first electrode 112 and the storage layer 114 in cross-sectional view are L-shaped, and the second electrode 116 in cross-sectional view may be square, rectangular or the like.

For example, the first electrode 112 incudes a first portion P1 and a second portion P2. The first portion P1 extends in a horizontal direction and may also be referred to as a horizontal portion. The second portion P2 extends in a vertical direction and may also be referred to as a vertical portion. The first portion P1 and/or the second portion P2 are disposed on the dielectric layer 108 and connected to the gate contact 109b. The second portion P2 penetrates through the dielectric layer 110 and has a height substantially the same as thickness of the dielectric layer 110. The top surface of the second portion P2 is covered by and in contact with the dielectric layer 120.

The storage layer 114 is disposed on the first portion P1 and laterally aside the second portion P2 of the first electrode 112. In some embodiments, the storage layer 114 includes a first portion 114a and a second portion 114b. The first portion 114a is located on the first portion P1 of the first electrode 112, extending in a horizontal direction, and may also be referred to as a horizontal portion. The second portion 114b is laterally aside and in physical contact with the second portion P2 of the first electrode 112, extending in a vertical direction, and may also be referred to as a vertical portion.

The second electrode 116 is disposed on the first portion 114a of the storage layer 114 and laterally aside the second portion 114b of the storage layer 114. In other words, the first portion 114a of the storage layer 114 is vertically sandwiched between and in physical contact with the first portion P1 of the first electrode 112 and the second electrode 116, while the second portion 114b of the storage layer 114 is laterally sandwiched between and in physical contact with the second portion P2 of the first electrode 112 and the second electrode 116.

In some embodiments, the data storage structure 118 includes a first sidewall S1 and a second sidewall S2 opposite to each other. The first sidewall S1 is a sidewall of the second portion P2 of the first electrode 112, while the storage layer 114 and the second electrode 116 are not exposed at the first sidewall S1 of the data storage structure 118. The second sidewall S2 includes the sidewall of the second electrode 116, the sidewall of the first portion 114a of the storage layer 114 and the sidewall of the first portion P1 of the first electrode 112, which may be substantially aligned with each other. In other words, the first sidewall S1 of the data storage structure 118 is homogeneous, while the second sidewall S2 of the data storage structure 118 is heterogeneous.

Still referring to FIG. 8A and FIG. 8B, in some embodiments, the memory cell MC1' includes a structure similar to the memory cell MC1. For example, the memory cell MC1' includes a transistor 106' and a data storage structure 118' connected to the transistor 106'. The transistor 106' includes a channel layer 102', a gate dielectric layer 103', a gate 104' and source/drains 101a'. The data storage structure 118' includes a first electrode 112', a storage layer 114' and a second electrode 116'. The first electrode 112' is electrically connected to the gate 104' of the transistor 106' through a gate contact 109b' disposed therebetween. Conductive lines 124a' are electrically connected to the source/drains 101a' through conductive vias 122a' and the contacts 109a'. The conductive line 124b' is electrically connected to the second electrode 116' of the data storage structure 118' through the conducive via 122b'.

In some embodiments, the data storage structure 118' is similar to the data storage structure 118. In some embodiments, the data storage structures 118 and 118' may be symmetrical to each other. For example, the first electrode 112' and the storage layer 114' may be inverted-L shaped, and the second electrode 116' is disposed over the horizontal portions of the storage layer 114' and the first electrode 112', and laterally aside the vertical portions of the storage layer 114' and the first electrode 112'.

The data storage structure 118' includes a first sidewall S1' and a second sidewall S2' opposite to each other. In some embodiments, the first sidewall S1' is the sidewall of the first electrode 112', while the second electrode 116' and the storage layer 114' are not exposed at the first sidewall S1'. The second sidewall S2' includes the sidewall of the second electrode 116', the sidewall of the storage layer 114' and the sidewall of the first electrode 112'. In other words, the first sidewall S1' is homogenous, while the second sidewall S2' may be heterogeneous.

In some embodiments, the second sidewall S2' of the data storage structure 118' is disposed to face the second sidewall S2 of the data storage structure 118. The dielectric layer 110 may include an additional part 110a disposed laterally between the second sidewall S2 of the data storage structure 118 and the second sidewall S2' of the data storage structure 118'. The conductive vias 122a and 122a' penetrate through the additional part 110a to be electrically connected to the contacts 109a and 109a', respectively. Portions of the conductive vias 122a and 122a' are embedded in the additional part 110a and laterally between the sidewall S2 of the data storage structure 118 and the sidewall S2' of the data storage structure 118'.

FIG. 9A to FIG. 9E are cross-sectional views illustrating a method of forming the semiconductor structure 500F according to some embodiments of the disclosure.

Figure 9A:
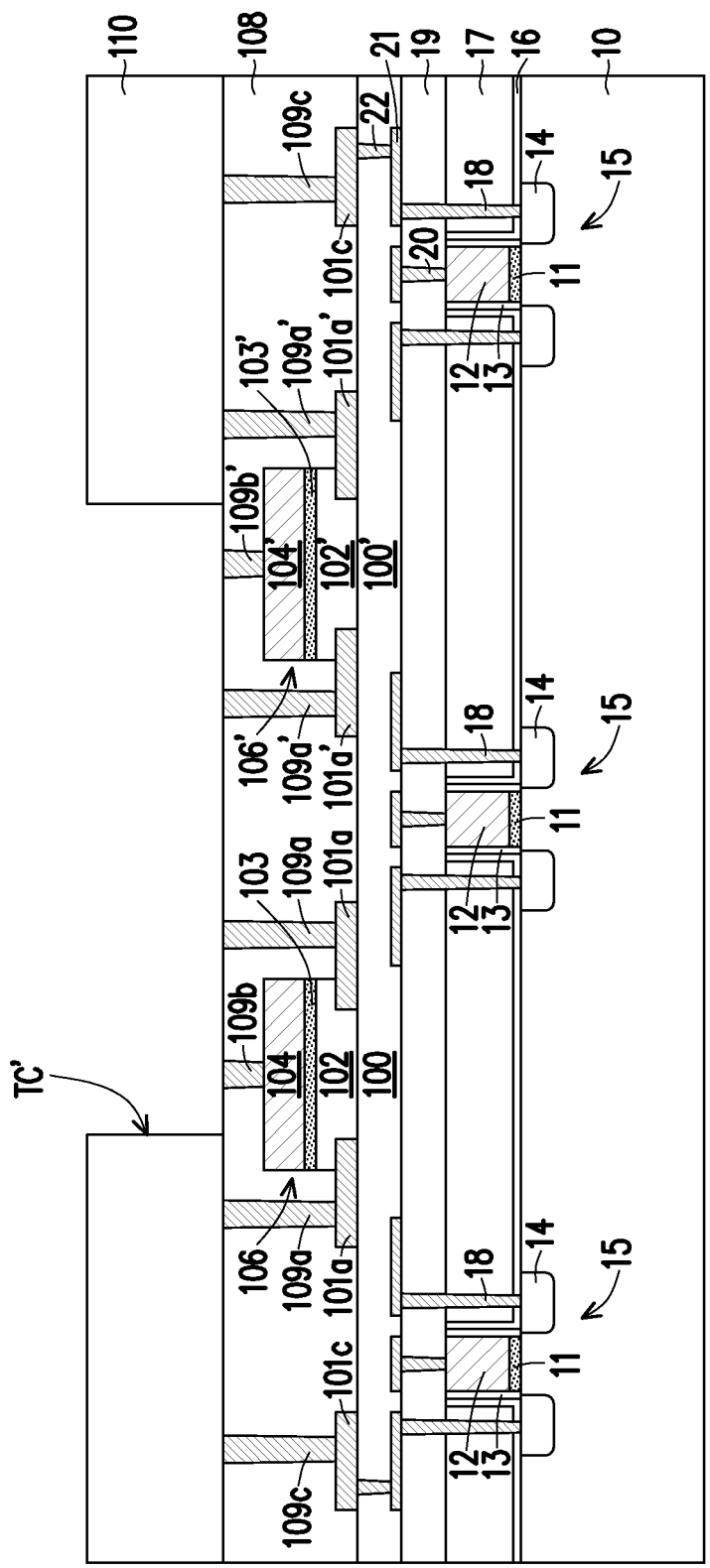
FIG. 9A to FIG. 9E are cross-sectional views illustrating various intermediate stages in the manufacturing of data storage structures of the memory device in FIG. 8A, according to some embodiments of the disclosure.

Referring to FIG. 9A, after the dielectric layer 110 is formed, a trench TC' is formed in the dielectric layer 110. In some embodiments, the trench TC' exposes the gate contacts 109b and 109b' of the transistors 106 and 106' and the source/drain contacts 109a between the gate contacts 109b and 109b', and a portion of the top surface of the dielectric layer 108.

Figure 9B:
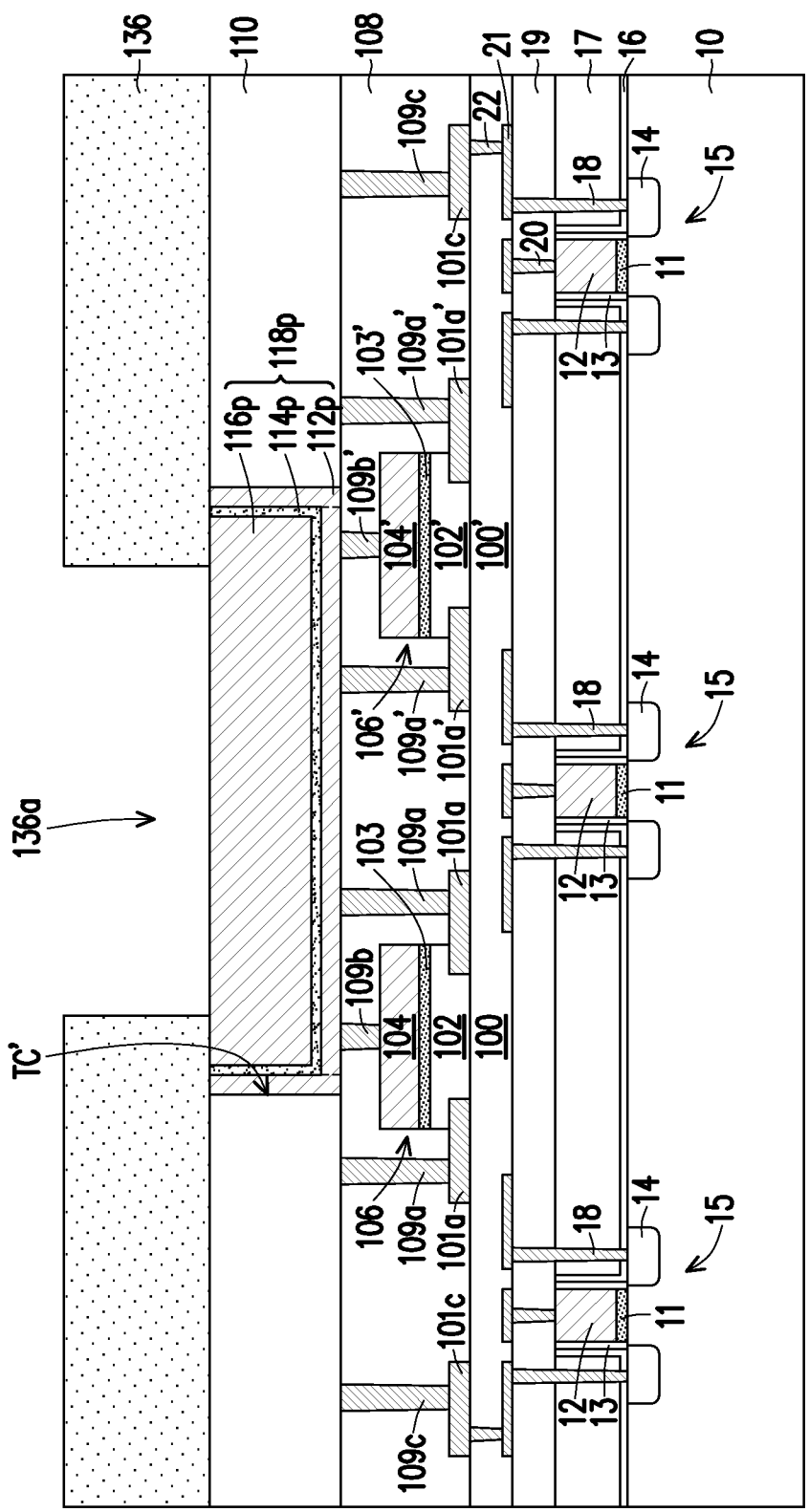

Referring to FIG. 9B, in some embodiments, a storage stack structure 118p including a first electrode material layer 112p, a storage material layer 114p and a second electrode material layer 116p is formed in the trench TC' by suitable deposition processes followed by a planarization process, which is similar to those described in FIG. 2I. In some embodiments, the top surfaces of the first electrode material layer 112p, the storage material layer 114p and the second electrode material layer 116p are substantially coplanar with the top surface of the dielectric layer 110.

Still referring to FIG. 9B, thereafter, a patterned mask layer 136 is formed on the dielectric layer 110 to cover portions of the storage stack structure 118p directly over the gate contacts 109b and 109b'. The patterned mask layer 136 has an opening 136a exposing a portion of the top surface of the second electrode material layer 116p. In some embodiments, the topmost surfaces of the first electrode material layer 112p and the storage layer 114p are covered by the patterned mask layer 136 without being exposed.

Figure 9C:
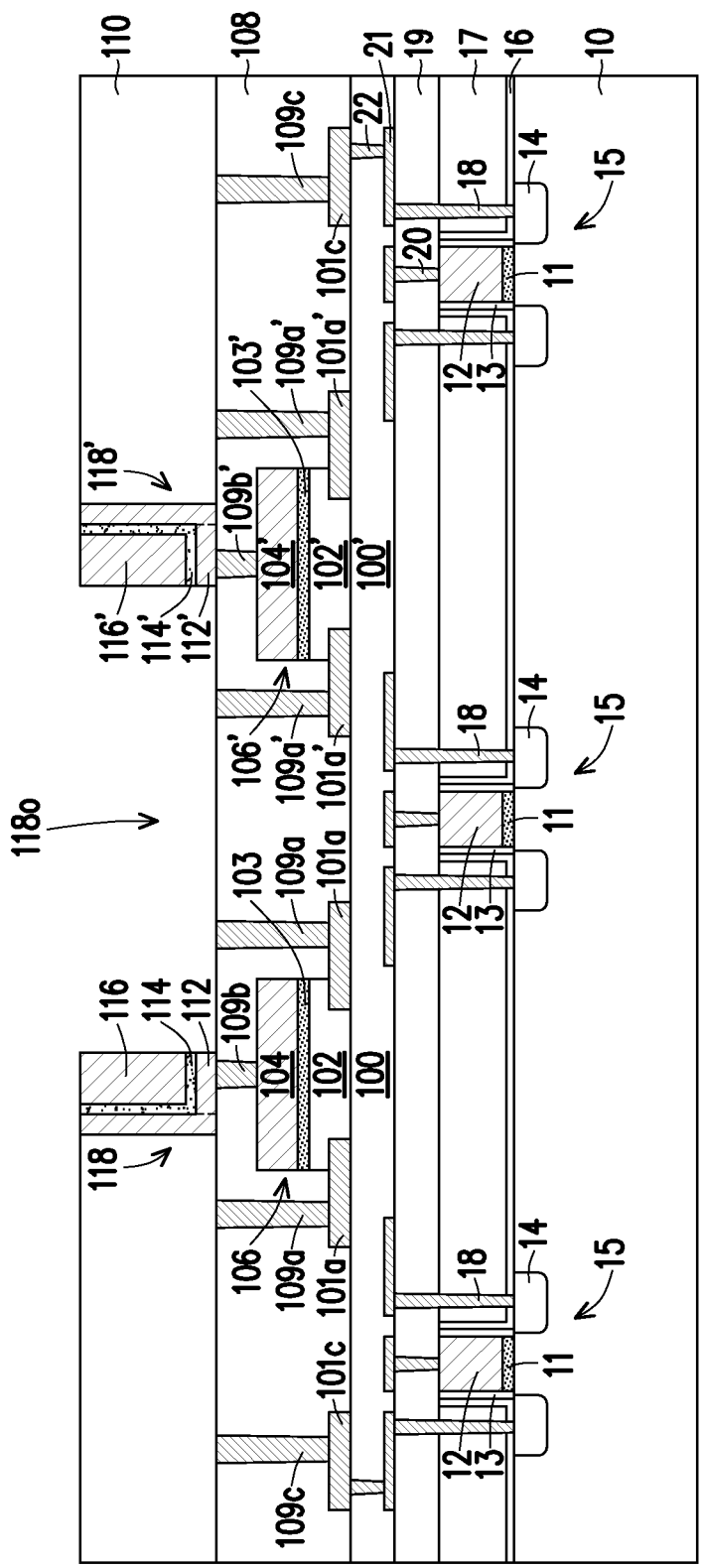

Referring to FIG. 9B and FIG. 9C, etching processes are performed to remove portions of the storage stack structure 118p exposed by the opening 136a of the patterned mask layer 136, using the patterned mask layer 136 as an etching mask. In some embodiments, the etching processes may be performed until the top surface of the dielectric layer 108 is exposed. Through the etching processes, the opening 136a of the patterned mask layer 136 is transferred into the storage stack structure 118p, and an opening 118o is formed in the storage stack structure 118p. In some embodiments, the opening 118o exposes a portion of the top surface of the dielectric layer 108 and the top surfaces of the source/drain contacts 109a/109a' between the gate contacts 109b and 109b'.

As such, the remained storage stack structure directly on the gate contact 109b form the data storage structure 118 including a first electrode 112, a storage layer 114 and a second electrode 116, and the remained storage stack structure directly on the gate contact 109b' form the data storage structure 118' including a first electrode 112', a storage layer 114' and a second electrode 116'. In other words, the storage stack structure 118p is cut/patterned into two data storage structures 118 and 118' that are laterally spaced from each other. The data storage structures 118 and 118' are electrically connected to the gates 104 and 104' of the transistors 106 and 106' through the gate contacts 109b and 109b', respectively.

Figure 9D:
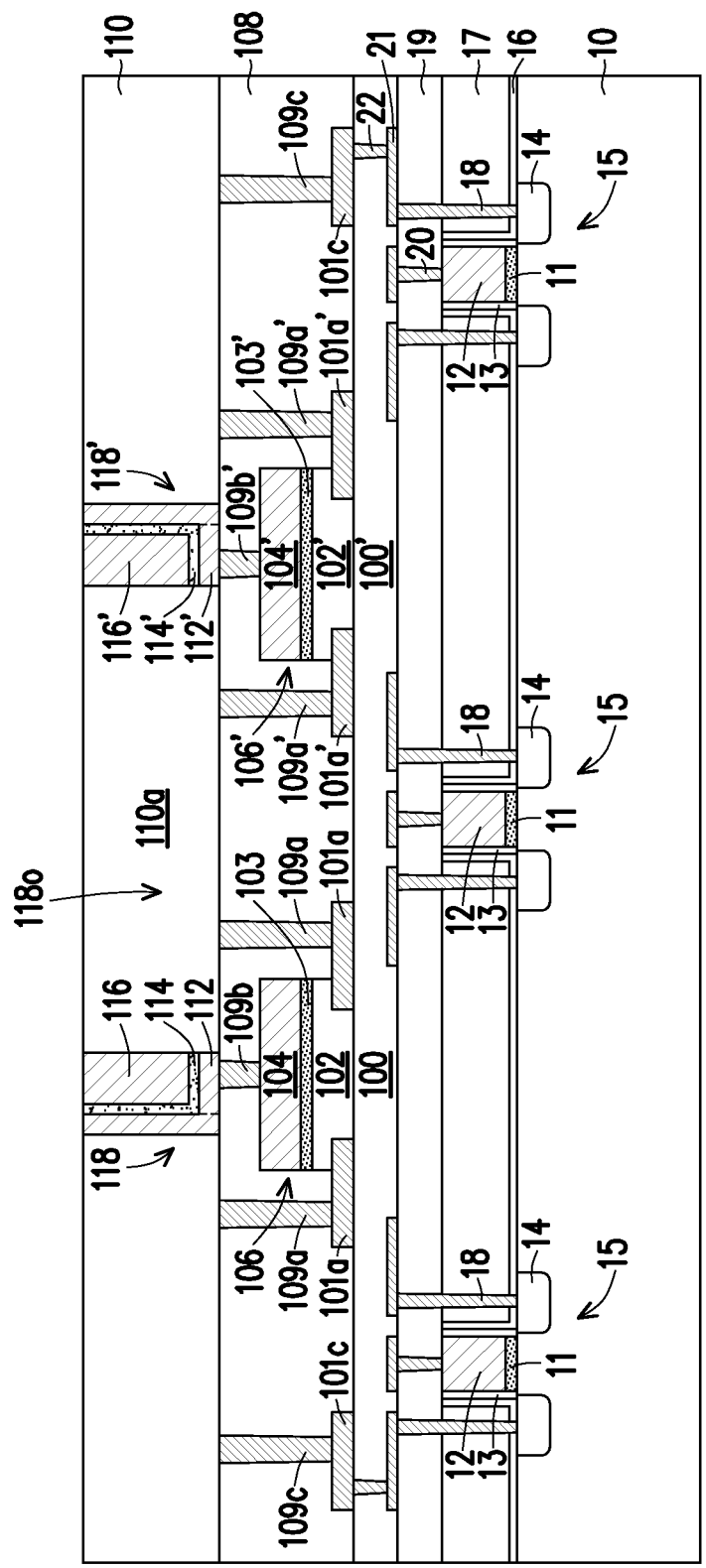

Referring to FIG. 9D, an additional dielectric layer 110a is formed on the dielectric layer 108 and laterally between the data storage structures 118 and 118', so as to fill the opening 1180. The material of the additional dielectric layer 110a may be the same as or different from the material of the dielectric layer 110. The additional dielectric layer 110a may also be referred to as an additional part of the dielectric layer 110. In some embodiments, the additional dielectric layer 110a may be formed by the following processes. A dielectric material is formed on the dielectric layer 108 to fill the opening 118o by a suitable deposition process such as CVD. In some embodiments, the dielectric material may overfill the opening 118o and cover the top surfaces of the data storage structures 118 and 118' and the dielectric layer 110. Thereafter, a planarization process (e.g., CMP) is performed to remove excess portions of the dielectric material outside the opening 118o, such that the top surfaces of the data storage structures 118 and 118' are exposed. In some embodiments, the top surface of the additional dielectric layer 110a is substantially coplanar with the top surfaces of the data storage structures 118 and 118' and the top surface of the dielectric layer 110.

Figure 9E:
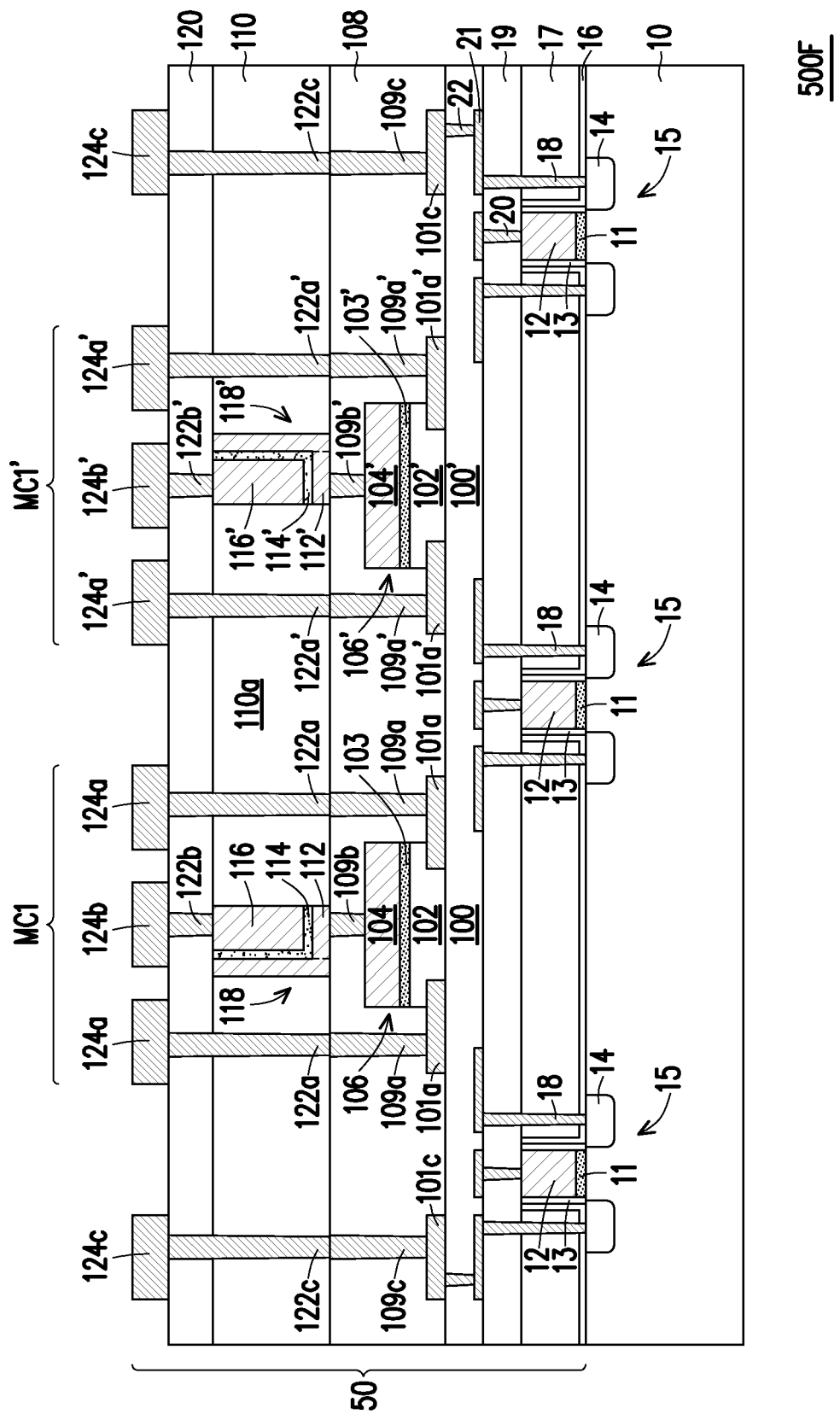

Referring to FIG. 9E, thereafter, processes similar to those described in FIG. 2J are performed, a dielectric layer 120 is formed on the dielectric layer 110, conductive vias 122a, 122a' and 122c are formed to penetrate through the dielectric layers 120 and 110 and connect to the contacts 109a, 109a' and conductive vias 109c, respectively. Conductive vias 122b and 122b' are formed in the dielectric layer 120 to connect to the second electrode 116 and 116' of the data storage structures 118 and 118'. Conductive lines 124a, 124a', 124b, 124b, and 124c are formed on the dielectric layer 120 to connect to the corresponding conductive vias underlying thereof.

Figure 10:
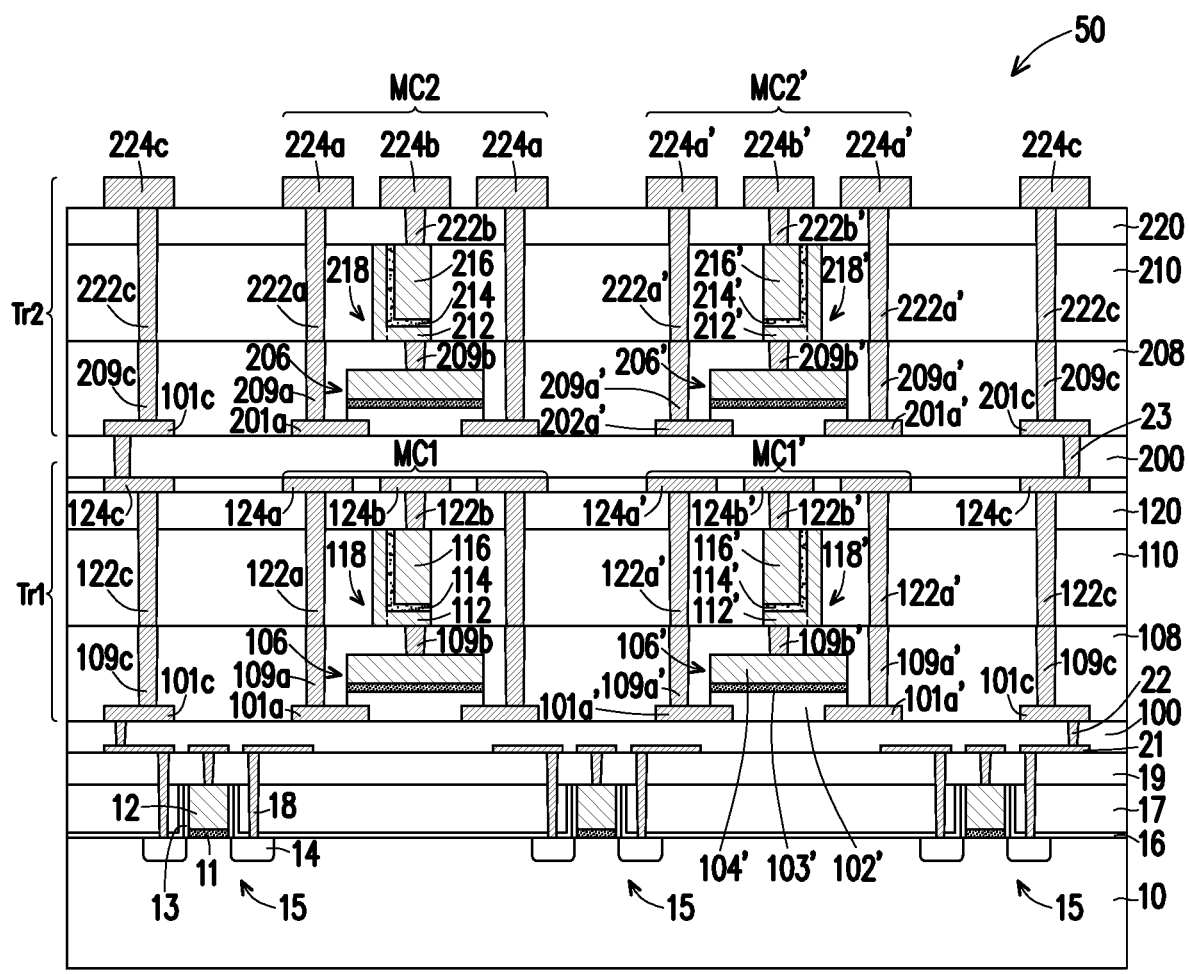
FIG. 10 is a cross-sectional view illustrating a semiconductor structure having memory device according to some embodiments of the disclosure.

FIG. 10 is a cross-sectional view illustrating a semiconductor structure 500G according to some other embodiments of the disclosure. The semiconductor structure 500G is similar to the semiconductor structure 500F, except that the semiconductor structure 500G includes more than one tiers of memory devices.

In some embodiments, the semiconductor structure 500G includes a first tier Tr1 of memory device and a second tier Tr2 of memory device stacked on the first tier Tr1 of memory device. It should be understood that the number of tiers (two tiers) of memory devices shown in FIG. 10 is merely for illustration, and the disclosure is not limited thereto. In the present disclosure, the semiconductor structure may include any suitable number of tiers of memory devices stacked on one another and embedded in the interconnection structure.

Some components in the second tier Tr2 of memory devices may be denoted with like-numbers in the first tier Tr1, plus number 100. For example, the transistors in first tier Tr1 is denoted as 106 and 106', while the transistors in second tier Tr2 are denoted as 206 and 206'; the data storage structure in first tier Tr1 is denoted as 118, while the data storage structure in the second tier Tr2 is denoted as 218, and so on. The properties, materials and forming methods of the components in the second tier Tr2 may thus be found in the discussion referring to FIG. 9 by referring to the features having the corresponding reference numbers in the first tier Tr1.

For example, the second tier Tr2 may include memory cells MC2 and MC2' stacked on the memory cells MC1 and MC1'. The memory cells MC2 and MC2' are disposed as side by side and embedded in the dielectric layers 208, 210 and 220. In some embodiments, the memory cells MC2 and MC2' may be stacked directly over the memory cells MC1 and MC1', and the memory cells MC2 and MC2' may be overlapped with the memory cells MC1 and MC1' in a direction perpendicular to a top surface of the substrate 10, respectively. However, the disclosure is not limited thereto. In some embodiments, the memory cells in the second tier Tr2 may be staggered with the memory cells in the first tier Tr1. The structures of the memory cells MC2 and MC2' and the interconnect wirings laterally aside the memory cells MC2 and MC2' are similar to those descried in the first tier Tr1, which are not described again here.

In the embodiments of the disclosure, the memory device is embedded in the interconnection structure and includes a data storage structure integrated with thin film transistor. As such, the footprint/size of the semiconductor structure may be decreased. Further, the memory device can be stackable in vertical direction to realize a 3D memory device, which may increase the memory density.

In accordance with some embodiments of the disclosure, a semiconductor structure includes a substrate, an interconnection structure disposed over the substrate and a first memory cell. The first memory cell is disposed over the substrate and embedded in dielectric layers of the interconnection structure. The first memory cell includes a first transistor and a first data storage structure. The first transistor is disposed on a first base dielectric layer and embedded in a first dielectric layer. The first data storage structure is embedded in a second dielectric layer and electrically connected to the first transistor. The first data storage structure includes a first electrode, a second electrode and a storage layer sandwiched between the first electrode and the second electrode.

In accordance with some alternative embodiments of the disclosure, a semiconductor structure includes a substrate, an interconnection structure and a memory device. The substrate has a first transistor partially embedded therein. The interconnection structure is disposed on the substrate. The interconnection structure includes dielectric layers over the first transistor and conductive features embedded in the dielectric layers and electrically connected to the first transistor. The memory device is embedded in the dielectric layers of the interconnection structure. The memory device includes a second transistor and a data storage structure. The second transistor is disposed on a base dielectric layer and embedded in a first dielectric layer. The data storage structure is embedded in a second dielectric layer and electrically connected to the second transistor.

In accordance with some embodiments of the disclosure, a method of forming a semiconductor structure includes the following processes. A substrate is provided. An interconnection structure is formed over the substrate. A first memory cell is formed to embed in the interconnection structure. The formation of the first memory cell includes forming a first transistor by the following process. A conductive layer is formed on a base dielectric layer. The conductive layer is patterned to form source/drain electrodes. A channel layer is formed on the base dielectric layer to partially cover the source/drain electrodes. A gate dielectric layer and a gate electrode are formed on the channel layer. The formation of the first memory cell further includes forming a first dielectric layer on the base dielectric layer to cover the first transistor; forming a second dielectric layer on the first dielectric layer; and forming a first data storage structure in the second dielectric layer and electrically connected to the first transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a substrate;
an interconnection structure over the substrate; and
a first memory cell over the substrate and embedded in dielectric layers of the interconnection structure, wherein the first memory cell comprises:
a first transistor on a first base dielectric layer and embedded in a first dielectric layer; and
a first data storage structure embedded in a second dielectric layer and electrically connected to the first transistor, wherein the first data storage structure comprises a first electrode, a second electrode, and a storage layer sandwiched between the first electrode and the second electrode;
wherein the storage layer wraps around a bottom corner of the second electrode from a bottom surface of the second electrode to a sidewall of the second electrode.
2. The semiconductor structure according to claim 1, wherein the first transistor comprises:
a channel layer, a gate dielectric layer, and a gate electrode vertically stacked on the first base dielectric layer; and
source/drain electrodes on sides of the gate electrode and partially covered by the channel layer, wherein bottom surfaces of the source/drain electrodes and the channel layer are in contact with the first base dielectric layer.
3. The semiconductor structure according to claim 2, wherein the first electrode of the first data storage structure is electrically connected to the gate electrode of the first transistor.
4. The semiconductor structure according to claim 1, wherein the storage layer comprises a ferroelectric material.

5. The semiconductor structure according to claim 1, wherein the first electrode comprises a base portion and a plurality of protruding portions protruding from a top surface of the base portion, and wherein a portion of the storage layer is on the base portion or a protruding portion of the plurality of protruding portions and is laterally sandwiched between the second electrode and the second dielectric layer.
6. The semiconductor structure according to claim 1, wherein the first electrode is laterally spaced apart from the second dielectric layer, and wherein portions of the storage layer and the second electrode are laterally between the first electrode and the second dielectric layer and are in contact with the first dielectric layer.
7. The semiconductor structure according to claim 1, wherein the first data storage structure comprises a first sidewall and a second sidewall opposite to each other, and wherein the first sidewall is homogenous while the second sidewall is heterogeneous.
8. The semiconductor structure according to claim 1, further comprising a second memory cell embedded in the interconnection structure and laterally aside the first memory cell, wherein the second memory cell comprises:
a second transistor embedded in the first dielectric layer and laterally aside the first transistor; and
a second data storage structure embedded in the second dielectric layer and electrically connected to the second transistor, wherein the first data storage structure and the second data storage structure are symmetrical with each other.
9. The semiconductor structure according to claim 1, further comprising:
a second base dielectric layer on the second dielectric layer; and
a second memory cell embedded in the interconnection structure and stacked over the first memory cell, wherein the second memory cell comprises:
a second transistor on the second base dielectric layer and embedded in a third dielectric layer; and
a second data storage structure embedded in a fourth dielectric layer and electrically connected to the second transistor.
10. A semiconductor structure, comprising:
a substrate having a first transistor partially embedded therein;
an interconnection structure on the substrate, wherein the interconnection structure comprises dielectric layers over the first transistor, and further comprises conductive features embedded in the dielectric layers and electrically connected to the first transistor; and
a memory device embedded in the dielectric layers of the interconnection structure, wherein the memory device comprises:
a second transistor on a base dielectric layer and embedded in a first dielectric layer; and
a data storage structure embedded in a second dielectric layer and electrically connected to the second transistors;
wherein the base dielectric layer is over an interlayer dielectric layer, which is on the substrate and laterally aside the first transistor.
11. The semiconductor structure according to claim 10, wherein the conductive features comprise conductive lines or conductive vias laterally aside the memory device and embedded in the base dielectric layer, the first dielectric layer, and the second dielectric layer.
12. The semiconductor structure according to claim 10, wherein the first transistor comprises source/drain regions in the substrate, a channel region in the substrate and between the source/drain regions of the first transistor, and a gate over the channel region of the first transistor;

wherein the second transistor comprises source/drain electrodes on the base dielectric layer, a channel layer between and overlying the source/drain electrodes of the second transistor, and a gate electrode over the channel layer of the second transistor; and wherein the source/drain regions of the first transistor comprise a semiconductor material, and the source/drain electrodes of the second transistor comprise a metallic material.

13. The semiconductor structure according to claim 12, wherein the conductive features comprise a conductive line embedded in the first dielectric layer and laterally aside the source/drain electrodes of the second transistor, and wherein the conductive line and the source/drain electrodes of the second transistor comprise a same material and have substantially coplanar top surfaces.

14. The semiconductor structure according to claim 10, wherein the data storage structure is a ferroelectric capacitor connected to a gate electrode of the second transistor.

15. A semiconductor structure, comprising:
a substrate; and
a first memory cell (MC) comprising:
a pair of source/drain electrodes spaced over the substrate;
a channel layer, a gate dielectric layer, and a gate electrode that overlie and are stacked directly on the source/drain electrodes;
a data storage structure overlying and electrically connected to the gate electrode; and
a via extending from the data storage structure to the gate electrode;
wherein the pair of source/drain electrodes comprises a first electrode, and wherein the channel layer wraps around a top corner of the first electrode from a top surface of the first electrode to a sidewall of the first electrode.

16. The semiconductor structure according to claim 15, wherein the channel layer, the gate dielectric layer, and the gate electrode form a pair of common sidewalls respectively overlying the source/drain electrodes.

17. The semiconductor structure according to claim 15, wherein the data storage structure comprises a metal-ferroelectric-metal (MFM) structure.

18. The semiconductor structure according to claim 15, wherein the data storage structure comprises a metal-insulator-metal (MIM) structure.

19. The semiconductor structure of claim 1, wherein the first transistor comprises a pair of source/drain electrodes and a channel layer that overlie the substrate and that are spaced from the substrate.

20. The semiconductor structure according to claim 1, wherein the storage layer has a U-shaped profile wrapping around a bottom of the second electrode.

* * * * *